US010923495B2

(12) United States Patent
Kim et al.

(10) Patent No.: US 10,923,495 B2
(45) Date of Patent: Feb. 16, 2021

(54) SEMICONDUCTOR MEMORY DEVICE WITH DIVIDED SOURCE PLATE

(71) Applicant: SK hynix Inc., Gyeonggi-do (KR)

(72) Inventors: Jin-Ho Kim, Gyeonggi-do (KR); Young-Ki Kim, Gyeonggi-do (KR); Jeong-Hwan Kim, Gyeonggi-do (KR); Sang-Hyun Sung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 99 days.

(21) Appl. No.: 16/199,356

(22) Filed: Nov. 26, 2018

(65) Prior Publication Data

US 2020/0020712 A1 Jan. 16, 2020

(30) Foreign Application Priority Data

Jul. 12, 2018 (KR) .................. 10-2018-0081062

(51) Int. Cl.
*H01L 27/11582* (2017.01)
*H01L 27/11575* (2017.01)
*H01L 27/11565* (2017.01)
*H01L 27/11573* (2017.01)

(52) U.S. Cl.
CPC .. *H01L 27/11582* (2013.01); *H01L 27/11565* (2013.01); *H01L 27/11573* (2013.01); *H01L 27/11575* (2013.01)

(58) Field of Classification Search
CPC ............................. H01L 27/115; H01L 23/528
USPC ........................................................ 257/98
See application file for complete search history.

(56) References Cited

U.S. PATENT DOCUMENTS

| 9,530,790 | B1* | 12/2016 | Lu ..................... | H01L 27/11582 |
| 2010/0133598 | A1* | 6/2010 | Chae ................. | H01L 27/11551 257/314 |
| 2017/0148800 | A1* | 5/2017 | Nishikawa ........ | H01L 29/40117 |
| 2017/0179154 | A1* | 6/2017 | Furihata ........... | H01L 27/11524 |
| 2017/0323898 | A1* | 11/2017 | Oh .................... | H01L 27/11565 |
| 2017/0330894 | A1* | 11/2017 | Lim .................. | H01L 27/11582 |
| 2019/0035807 | A1* | 1/2019 | Kim ................. | H01L 27/11582 |

FOREIGN PATENT DOCUMENTS

| KR | 101087476 | 11/2011 |
| KR | 1020150106660 | 9/2015 |
| KR | 1020160131458 | 11/2016 |

* cited by examiner

*Primary Examiner* — Sheng-Bai Zhu
(74) *Attorney, Agent, or Firm* — IP & T Group LLP

(57) ABSTRACT

A semiconductor memory device includes a substrate including a cell region and a slimming region; a logic structure disposed over the substrate, the logic structure including logic circuit elements and bottom wiring lines electrically coupled to the logic circuit elements; a source plate disposed over the logic structure; a memory structure including a plurality of memory cells and a plurality of gate electrode layers, wherein the plurality of memory cells are disposed over the source plate of the cell region and a plurality of gate electrode layers are stacked over the source plate of the cell region and the slimming region to be separated from one another and are coupled to the plurality of memory cells; and a first slit cutting the source plate at a boundary between the cell region and the slimming region, wherein the source plate of the slimming region is floated regardless an operation of the memory cells and the logic circuit elements.

22 Claims, 25 Drawing Sheets

FIG.2
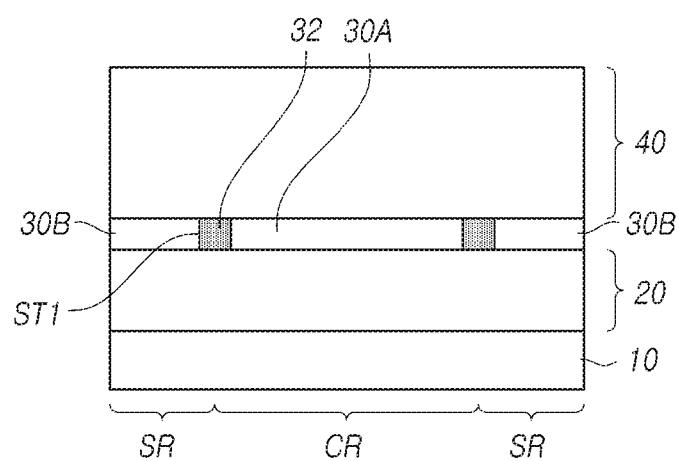
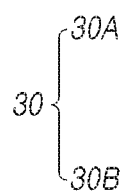

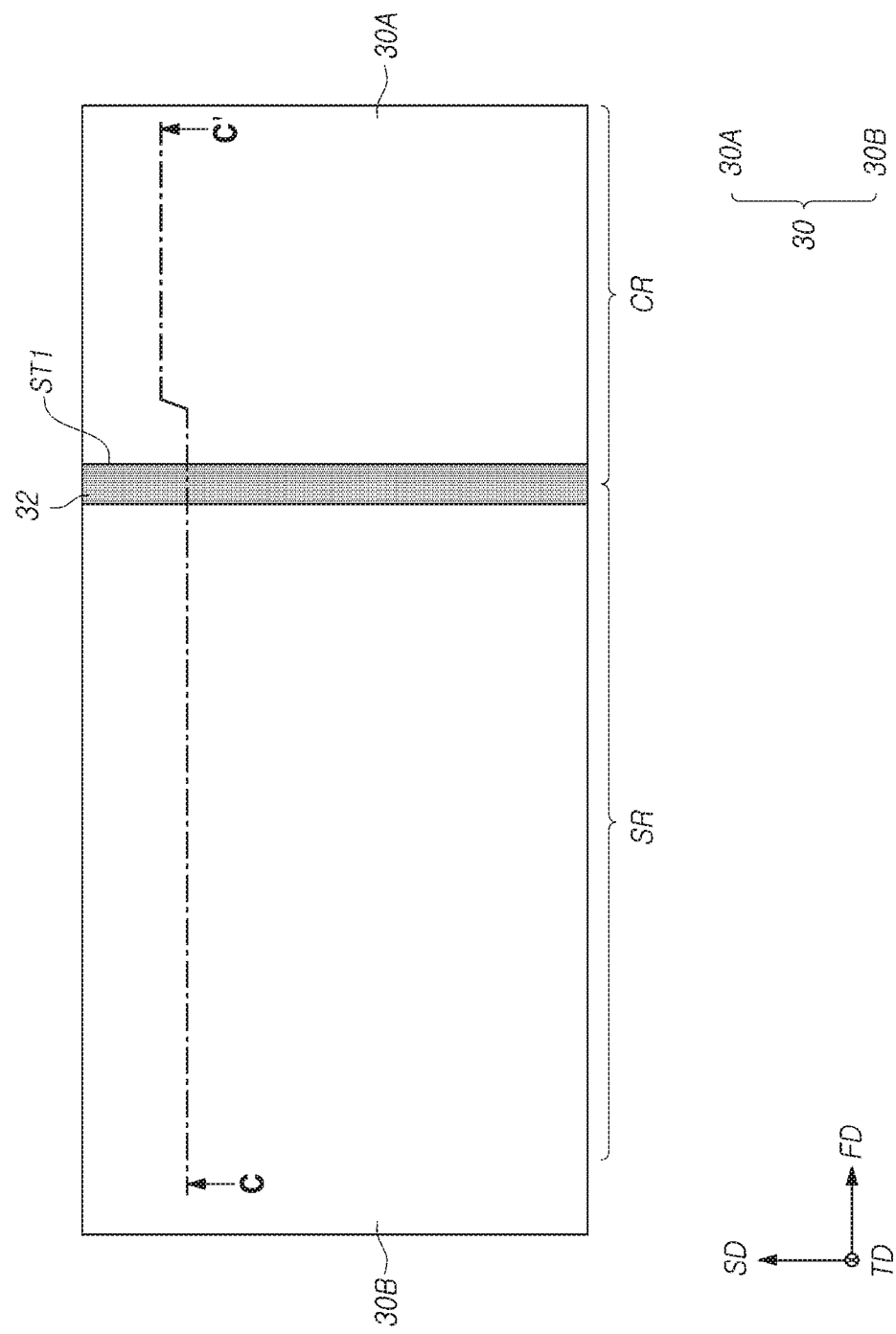

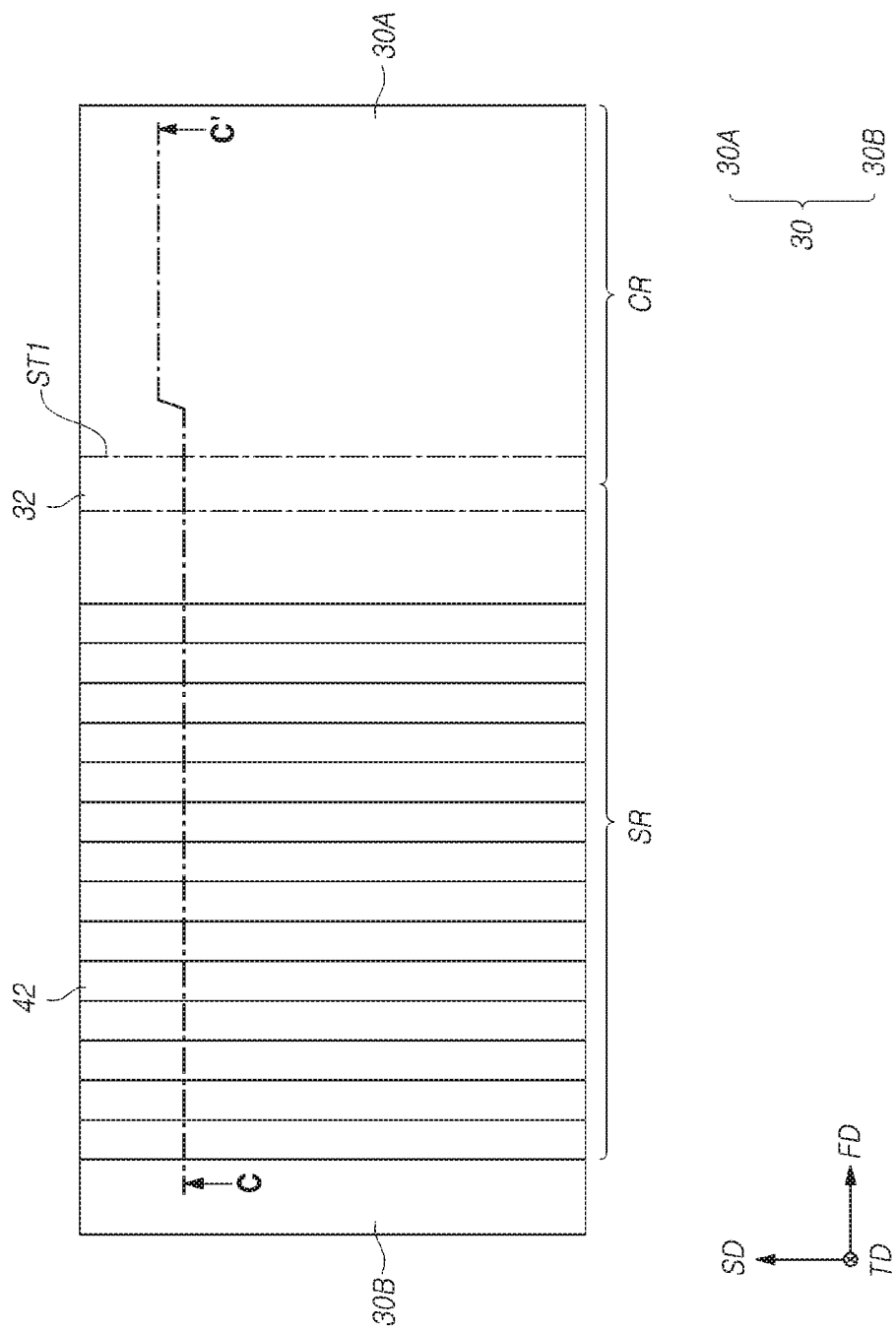

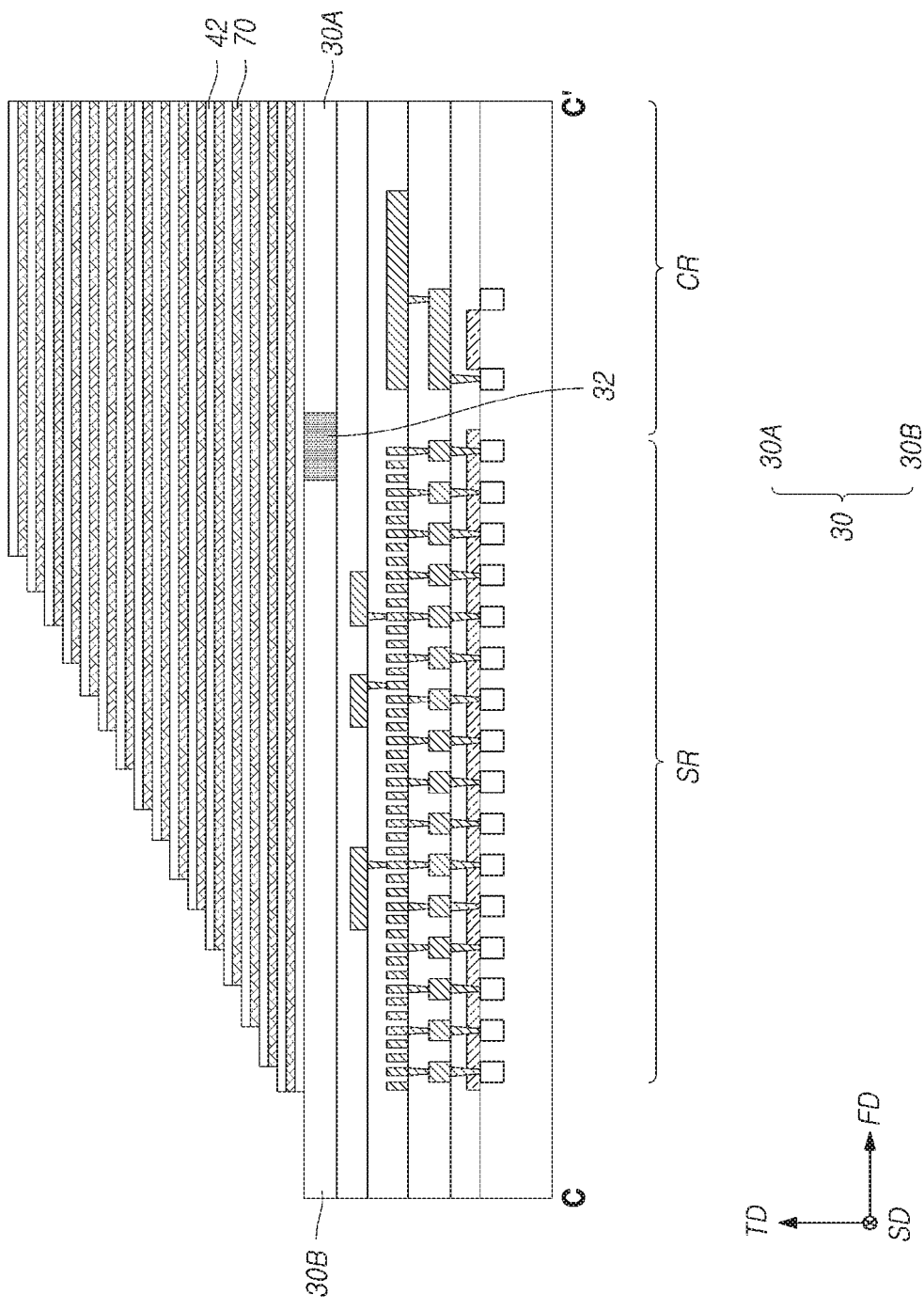

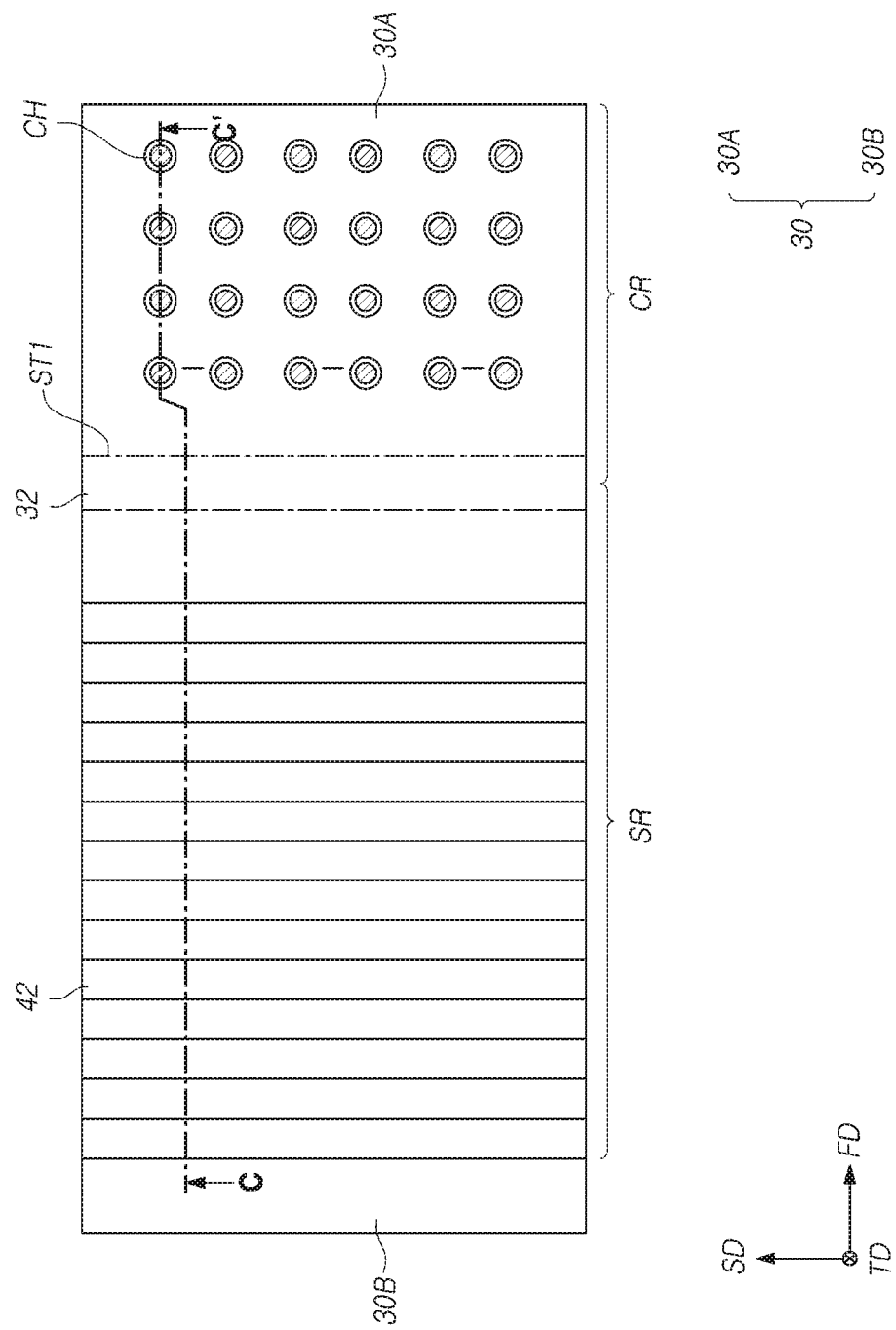

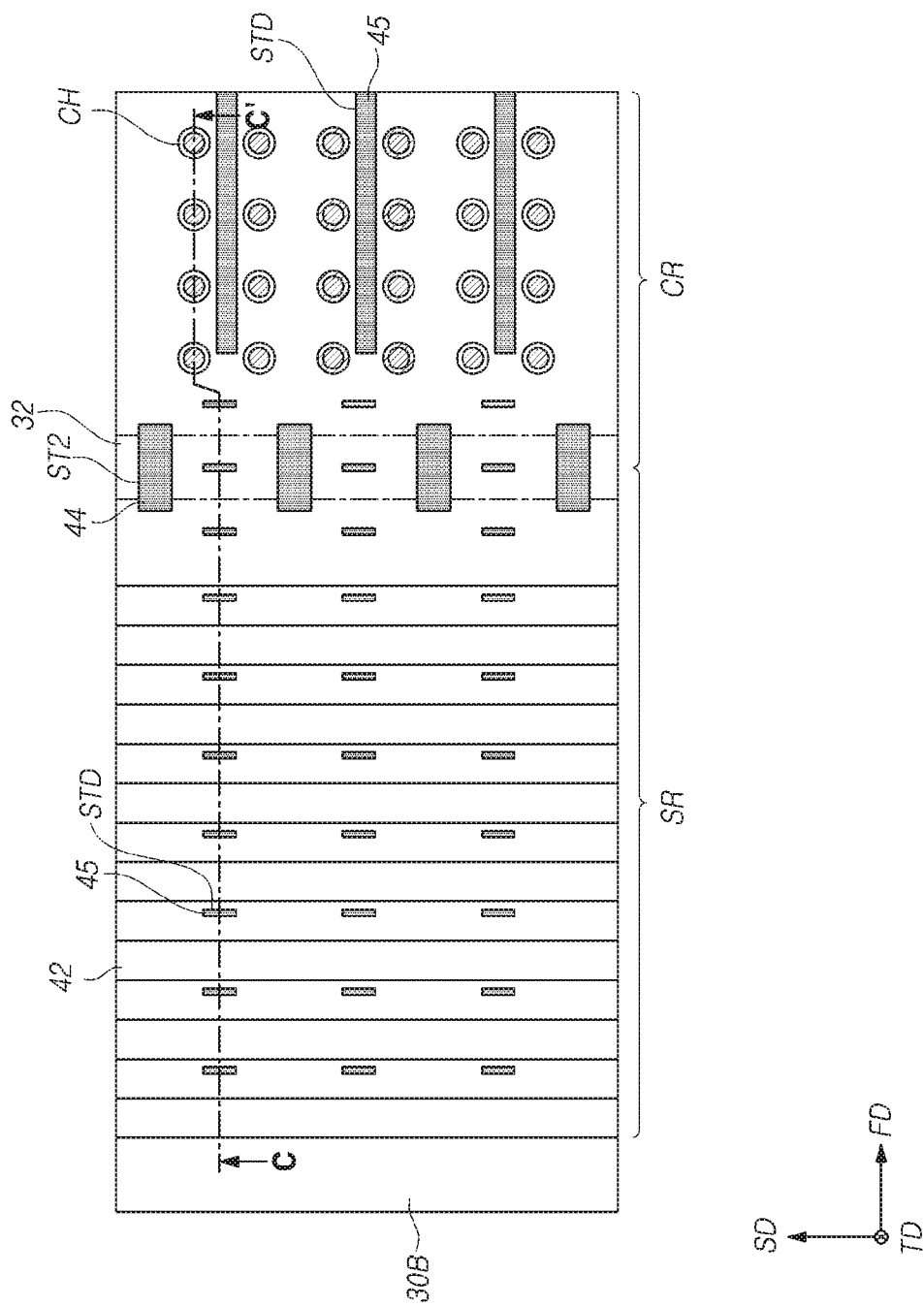

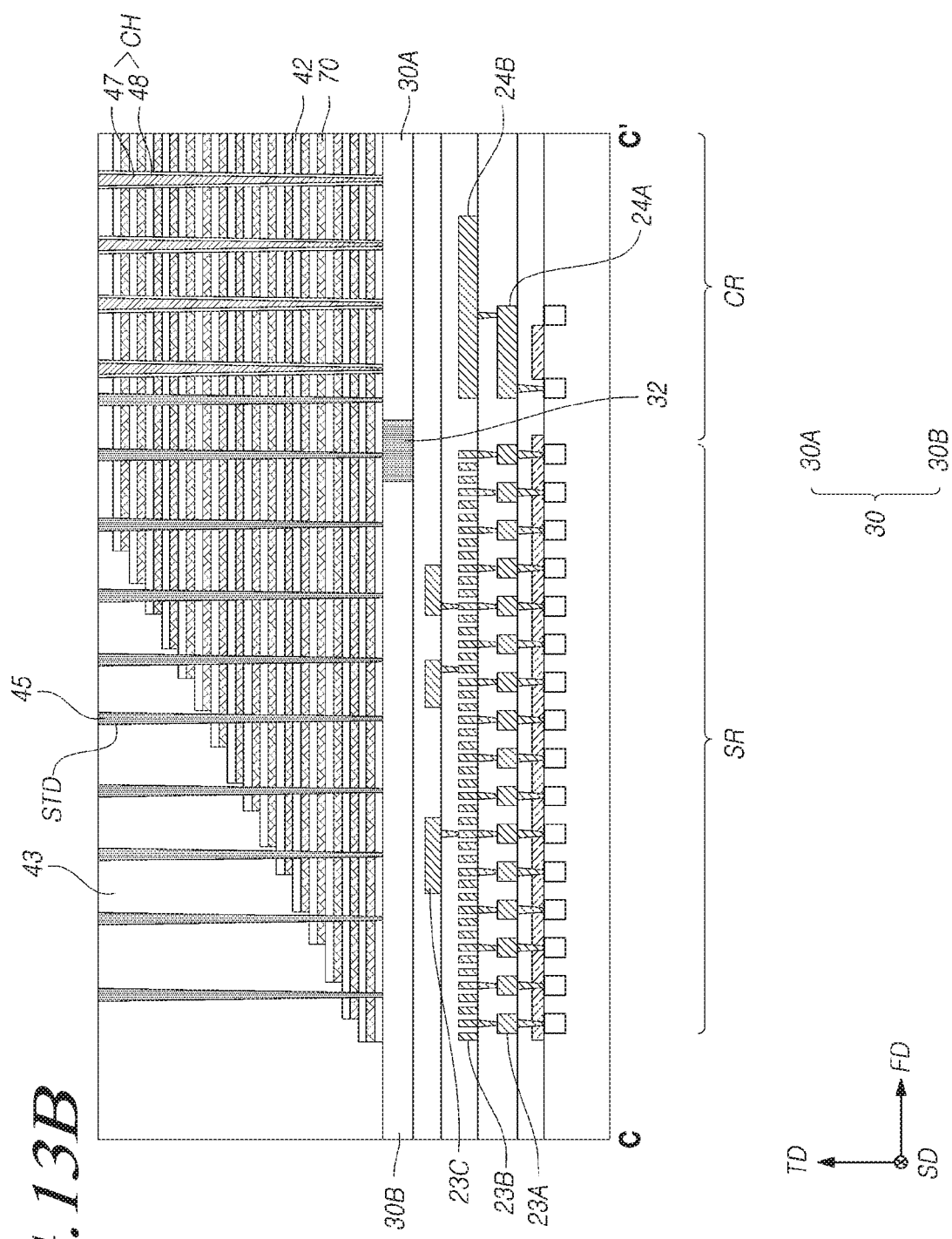

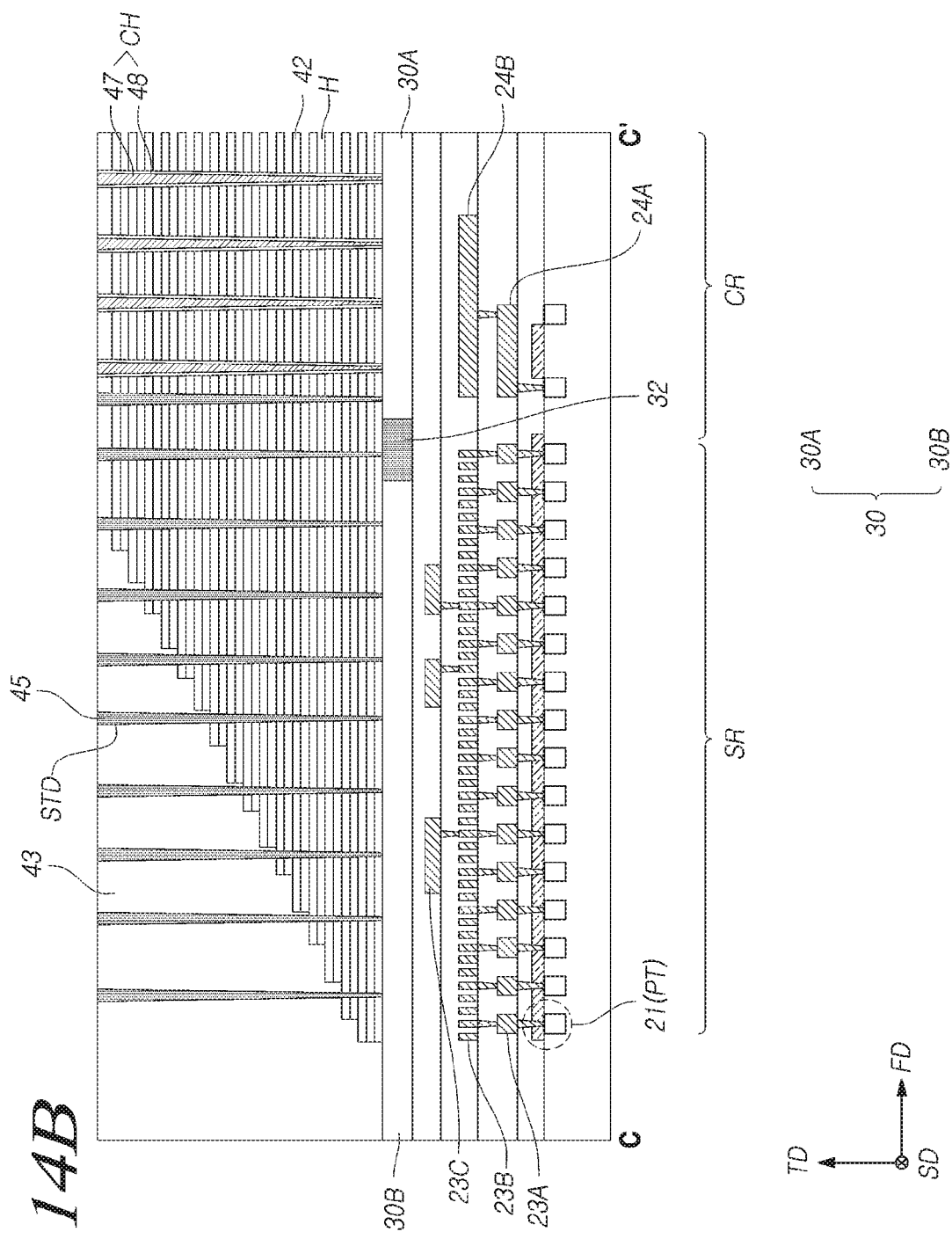

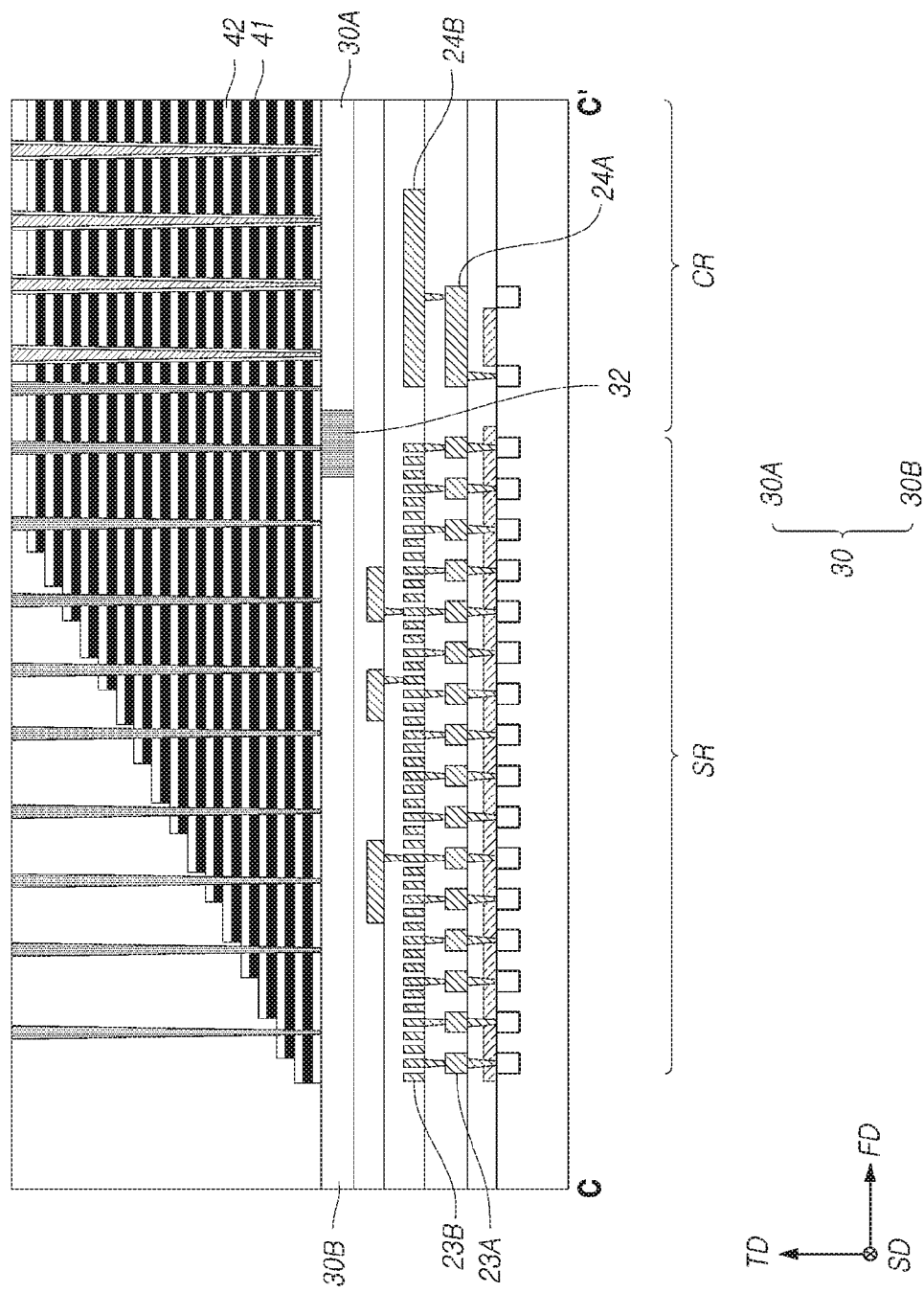

SEMICONDUCTOR MEMORY DEVICE WITH DIVIDED SOURCE PLATE

CROSS-REFERENCE TO RELATED APPLICATION

The present application claims priority under 35 U.S.C. 119(a) to Korean Patent Application No. 10-2018-0081062 on Jul. 12, 2018, which is incorporated herein by reference in its entirety.

BACKGROUND

1. Technical Field

Various embodiments generally relate to a semiconductor memory device and, more particularly, to a semiconductor memory device of a three-dimensional structure.

2. Related Art

In recent years, there has been a demand for large capacity and high integration of a semiconductor memory device in step with multifunctionality of an information communication device, and the structures of a logic circuit and wiring lines included in the semiconductor memory device for the operation and electrical coupling of the semiconductor memory device have been complicated. Accordingly, a semiconductor memory device having excellent electrical characteristics is required.

SUMMARY

A large capacity, high integration semiconductor memory device having excellent electrical characteristics is provided.

In an embodiment, a semiconductor memory device may include: a substrate including a cell region and a slimming region; a logic structure disposed over the substrate, the logic structure including logic circuit elements and bottom wiring lines electrically coupled to the logic circuit elements; a source plate disposed over the logic structure; a memory structure including a plurality of memory cells and a plurality of gate electrode layers, wherein the plurality of memory cells are disposed over the source plate of the cell region and the plurality of gate electrode layers are stacked over the source plate of the cell region and the slimming region to be separated from one another and are coupled to the plurality of memory cells; and a first slit cutting the source plate at a boundary between the cell region and the slimming region. The source plate of the slimming region is floated regardless of an operation of the memory cells and the logic circuit elements.

In an embodiment, a semiconductor memory device may include: a memory structure including a plurality of gate electrode layers and a plurality of interlayer dielectric layers which are alternately stacked over a source plate of a cell region and a slimming region, and a plurality of channel structures coupled to the source plate of the cell region through the gate electrode layers and the interlayer dielectric layers; a logic structure disposed between a substrate and the source plate, and including logic circuit elements configured to control the memory structure and bottom wiring lines which are coupled to the logic circuit elements; and a first slit cutting the source plate at a boundary between the cell region and the slimming region. The source plate of the slimming region is electrically isolated from the source plate of the cell region and the logic structure.

In an embodiment, a semiconductor memory device may include: a substrate including a cell region and a slimming region; a logic structure disposed over the substrate, the logic structure including logic circuit elements and bottom wiring lines electrically coupled to the logic circuit elements, source plate disposed on the logic structure, a memory structure disposed over the source plate of the cell region, the memory structure including a plurality of spaced-apart gate electrode layers having a stepped structure in the slimming region, and a first slit cutting the source plate at a boundary between the cell region and the slimming region. The source plate of the slimming region is floated regardless an operation of the memory cells and the logic circuit elements.

These and other features and advantages of the present invention will become clear to those skilled in the art to which the present invention belongs from the following detailed description in conjunction with the accompanying drawings.

BRIEF DESCRIPTION OF THE DRAWINGS

FIG. 2 is a cross-sectional view illustrating an exemplary configuration of the schematic layout of a semiconductor memory device in accordance with an embodiment of the present disclosure.

FIGS. 10A to 15C are exemplary configurations of views to assist in the explanation of a method for manufacturing a semiconductor memory device in accordance with an embodiment of the present disclosure.

DETAILED DESCRIPTION

Hereinafter, a semiconductor memory device will be described below with reference to the accompanying drawings through various embodiments.

Figure 1:
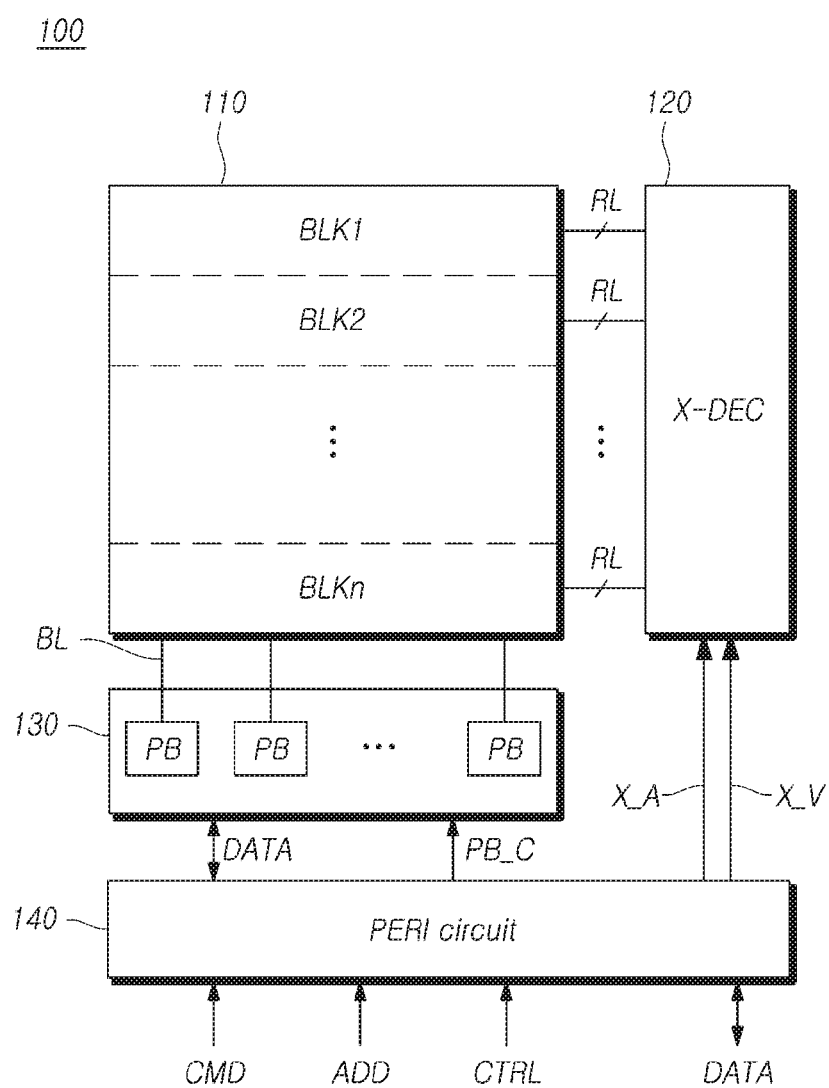
FIG. 1 is a block diagram illustrating an exemplary configuration of a semiconductor memory device in accordance with an embodiment of the present disclosure.

FIG. 1 is a block diagram illustrating an exemplary configuration of a semiconductor memory device in accordance with an embodiment of the present disclosure.

Referring to FIG. 1, a semiconductor memory device 100, in accordance with an embodiment, may include a memory cell array 110, a row decoder 120, a page buffer circuit 130 and a peripheral circuit 140.

The memory cell array 110 may include a plurality of memory blocks BLK1 to BLKn. While not shown, each of the memory blocks BLK1 to BLKn may include a plurality of memory cells. A memory cell may be accessed by a word line and a bit line. A memory cell may be a volatile memory cell which loses data stored therein in the case where power supply is interrupted, or may be a nonvolatile memory cell which retains data stored therein even though power supply is interrupted.

While it is described below that the semiconductor memory device 100 is a vertical NAND flash device, it is to be understood that the technical spirit of the present disclosure is not limited thereto.

The row decoder 120 may be coupled to the memory cell array 110 through row lines RL. The row lines RL may include at least one drain select line, a plurality of word lines and at least one source select line. The row decoder 120 may select one among the memory blocks BLK1 to BLKn of the memory cell array 110 depending on an address information. The row decoder 120 may transfer an operating voltage X_V from the peripheral circuit 140, for example, a program voltage, a pass voltage and a read voltage, to the row lines RL coupled to a selected memory block. For controlling the transfer of the various operating voltages X_V, the row decoder 120 may include a plurality of pass transistors which are respectively coupled to corresponding row lines RL. For example, at least one transistor may be coupled to each of the row lines RL.

The page buffer circuit 130 may be coupled to the memory cell array 110 through a plurality of bit lines BL. The page buffer circuit 130 may include a plurality of page buffers PB which are respectively coupled to the plurality of the bit lines BL. For example, each page buffer PB may be coupled to a single corresponding bit line BL. The page buffer circuit 130 may receive a page buffer control signal PB_C from the peripheral circuit 140, and may transmit and receive a data signal DATA to and from the peripheral circuit 140.

The page buffer circuit 130 may control a bit line which is coupled with the memory cell array 110, in response to the page buffer control signal PB_C, For example, the page buffer circuit 130 may detect data stored in a memory cell of the memory cell array 110 by sensing the signal of a bit line BL of the memory cell array 110 in response to the page buffer control signal PB_C, and may transmit the data signal DATA to the peripheral circuit 140 depending on the detected data. The page buffer circuit 130 may apply a signal to a bit line BL based on the data signal DATA received from the peripheral circuit 140 in response to the page buffer control signal PB_C, and thereby, may write data in a memory cell of the memory cell array 110. The page buffer circuit 130 may write data in or read data from a memory cell which is coupled to a word line activated by the row decoder 120.

The peripheral circuit 140 may receive a command signal CMD, an address signal ADD and a control signal CTRL from outside the semiconductor memory device 100, and may transmit and receive data DATA to and from a device outside the semiconductor memory device 100, for example, a memory controller. The peripheral circuit 140 may output signals for writing data DATA in the memory cell array 110 or reading data DATA from the memory cell array 110, for example, a row address X_A, the page buffer control signal PB_C and so forth, based on the command signal CMD, the address signal ADD and the control signal CTRL. The peripheral circuit 140 may generate various voltages including the operating voltage X_V, which are required in the semiconductor memory device 100.

Figure 3A:
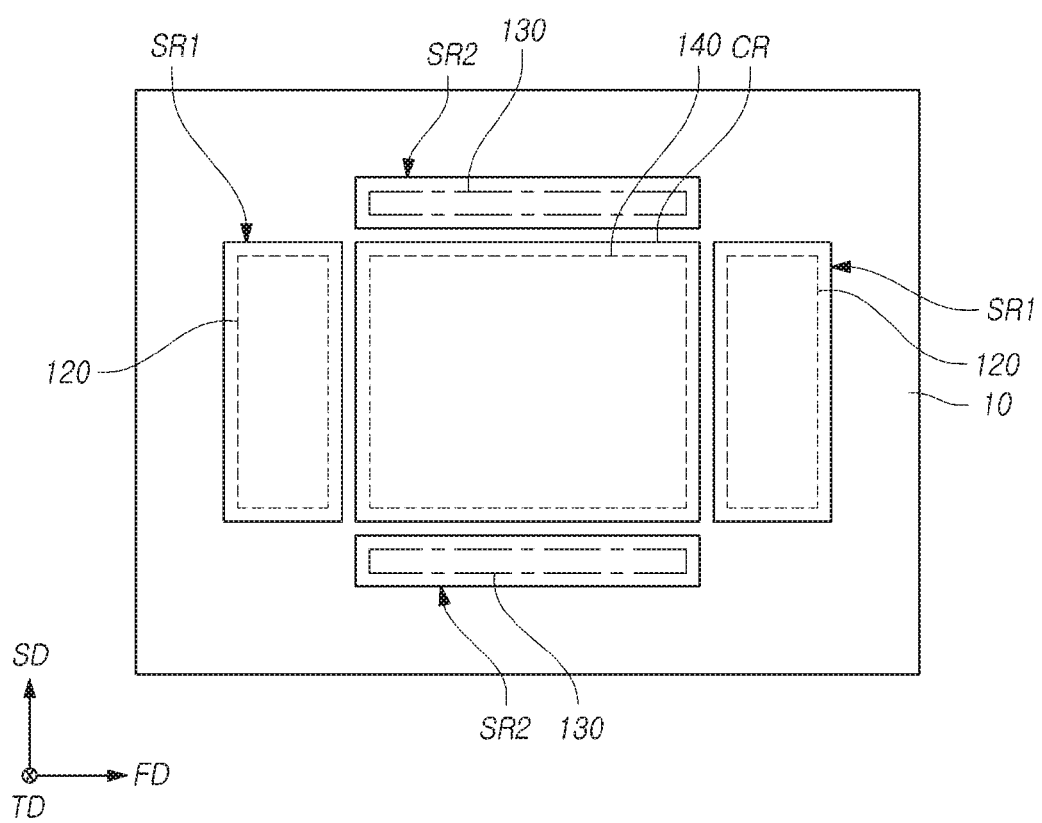
FIGS. 3A and 3B are top views illustrating exemplary configurations of regions of semiconductor memory devices in accordance with embodiments of the present disclosure.
Figure 3B:
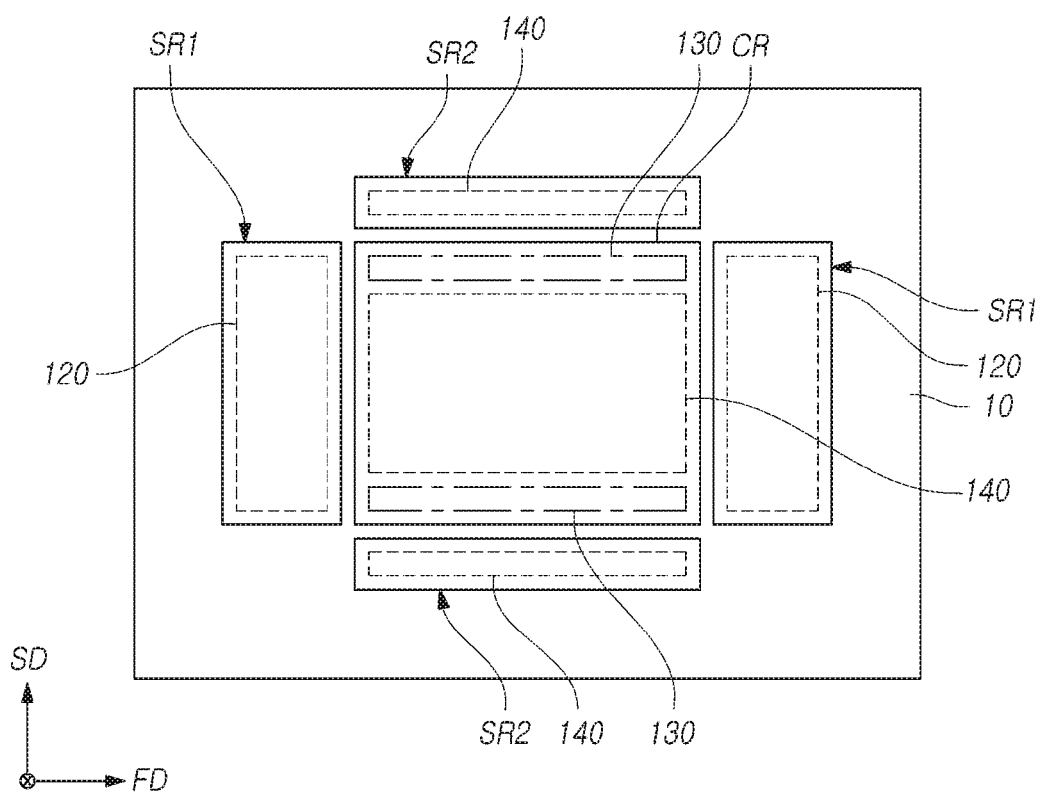

FIG. 2 is a cross-sectional view illustrating an exemplary configuration of the schematic layout of a semiconductor memory device in accordance with an embodiment, and FIGS. 3A and 3B are top views illustrating exemplary configurations of regions of semiconductor memory devices in accordance with embodiments of the present disclosure.

Referring to FIG. 2, a cell region CR and a slimming region SR may be defined in a substrate 10. The slimming region SR may be disposed adjacent to each one of the edges of the cell region CR.

A semiconductor memory device 100 may include a logic structure 20 which is disposed on the substrate 10, a source plate 30 which is disposed on the logic structure 20, and a memory structure which is disposed on the source plate 30. The memory structure may include the memory cell array 110 of FIG. 1, and the logic structure 20 may include logic circuits for controlling the memory cell array 110 included in the memory structure 40, for example, the row decoder 120, the page buffer circuit 130 and the peripheral circuit 140 of FIG. 1.

The source plate 30 may be cut by a first slit ST1 at each boundary between the cell region CR and the slimming region SR. A first slit dielectric layer 32 may be filled in the first slit ST1. The source plate 30 may be divided into first and second source plates 30A and 30B by the first slit ST1 and the first slit dielectric layer 32.

The first source plate 30A may be disposed in the cell region CR, and the second source plate 30B may be disposed in the slimming region SR. The second source plate 30B of the slimming region SR may be physically and electrically isolated from the first source plate 30A of the cell region CR. In the present embodiment, by isolating the second source plate 30B of the slimming region SR from the first source plate 30A of the cell region CR, it is possible to suppress the electrical interference between the source plate 30 and the logic structure 20.

Referring to FIGS. 3A and 3B, a slimming region may include first slimming regions SR1 and second slimming regions SR2. The first slimming regions SR1 may be disposed at both sides of a cell region CR which face each other in a first direction FD, and the second slimming regions SR2 may be disposed at both sides of the cell region CR which face each other in a second direction SD. The first direction FD may correspond to the extending direction of word lines, and the second direction SD may correspond to the extending direction of bit lines. A direction that is perpendicular to the top surface of the substrate 10 corresponds to a third direction TD.

A row decoder 120 may be disposed in the first slimming regions SR1. A page buffer circuit 130 may be disposed in the second slimming regions SR2 as shown in FIG. 3A. A page buffer circuit 130 may be disposed in the edges of the cell region CR which are adjacent to the second slimming regions SR2, as shown in FIG. 3B.

A peripheral circuit 140 may be disposed in various patterns as occasion demands. For example, in an embodiment, the peripheral circuit 140 may be disposed in the cell region CR as shown in FIG. 3A. As another example, in another embodiment, the peripheral circuit may be disposed by being distributed in the cell region CR and the second slimming regions SR2 as shown in FIG. 3B. In another embodiment, (not shown), the peripheral circuit 140 may be disposed outside the cell region CR and the first and second slimming regions SR1 and SR2.

Figure 4:
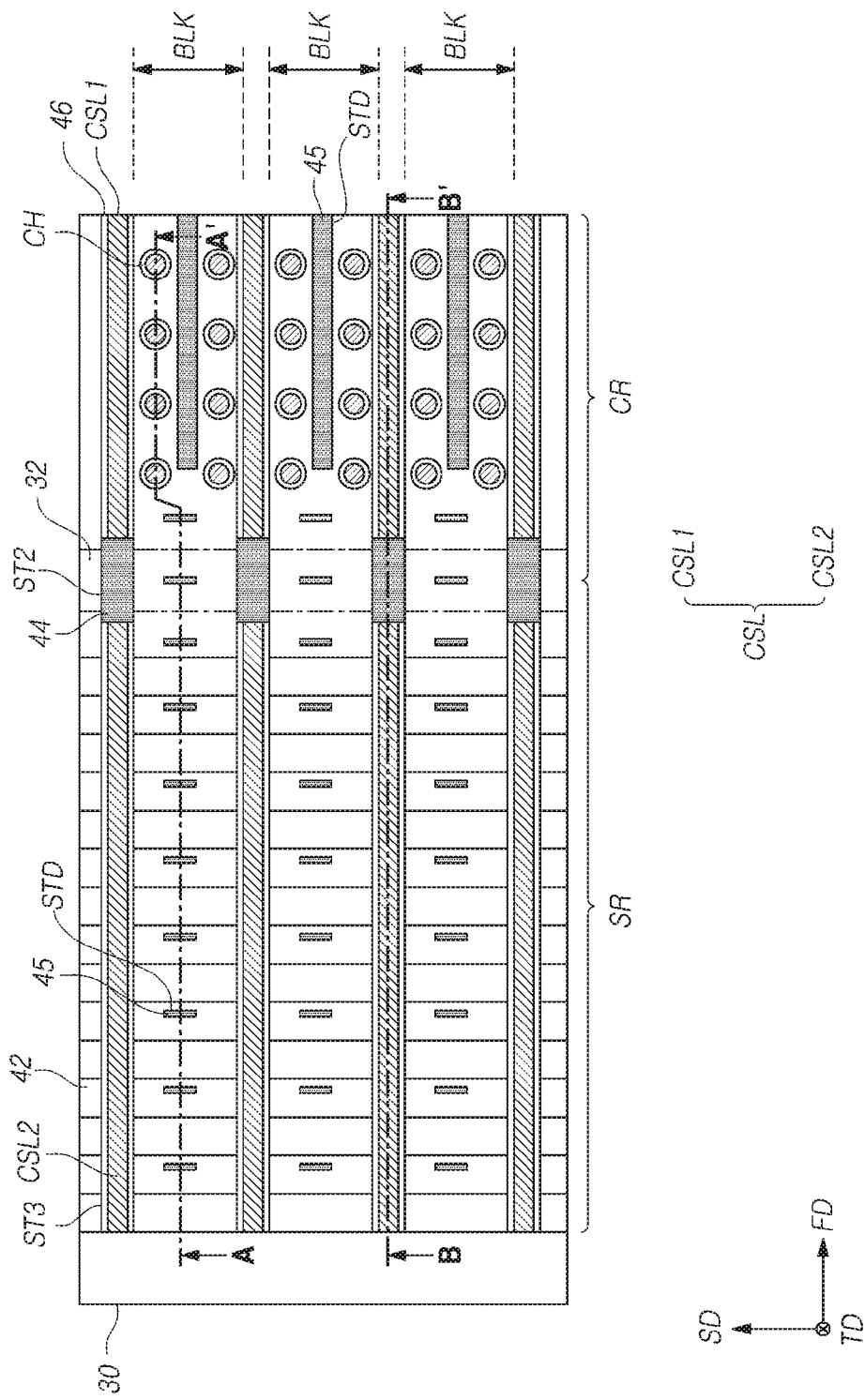
FIG. 4 is a top view illustrating an exemplary configuration of a portion of a semiconductor memory device in accordance with an embodiment of the present disclosure.
Figure 5:
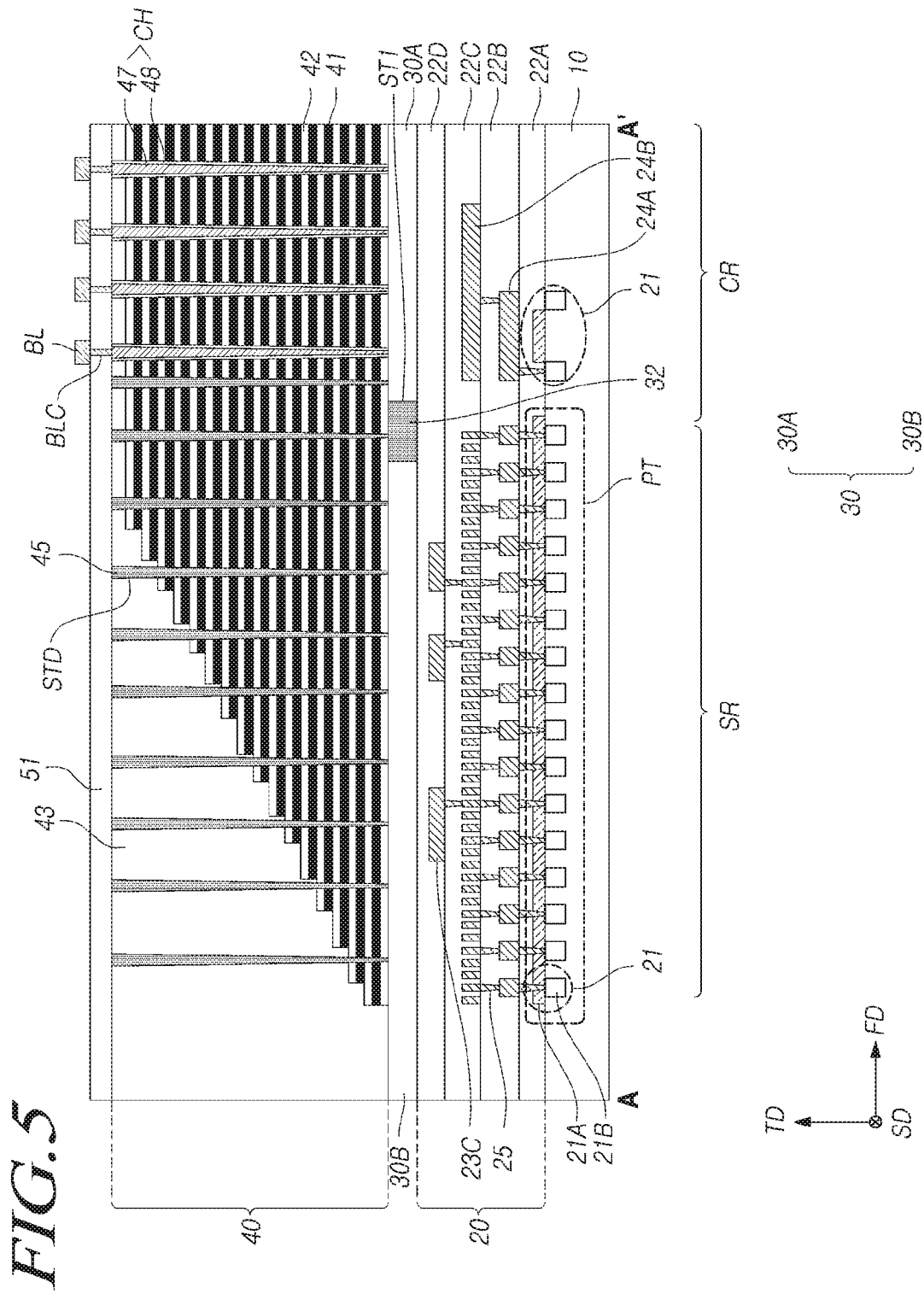
FIG. 5 is a cross-sectional view taken along the line A-A' of FIG. 4.
Figure 6:
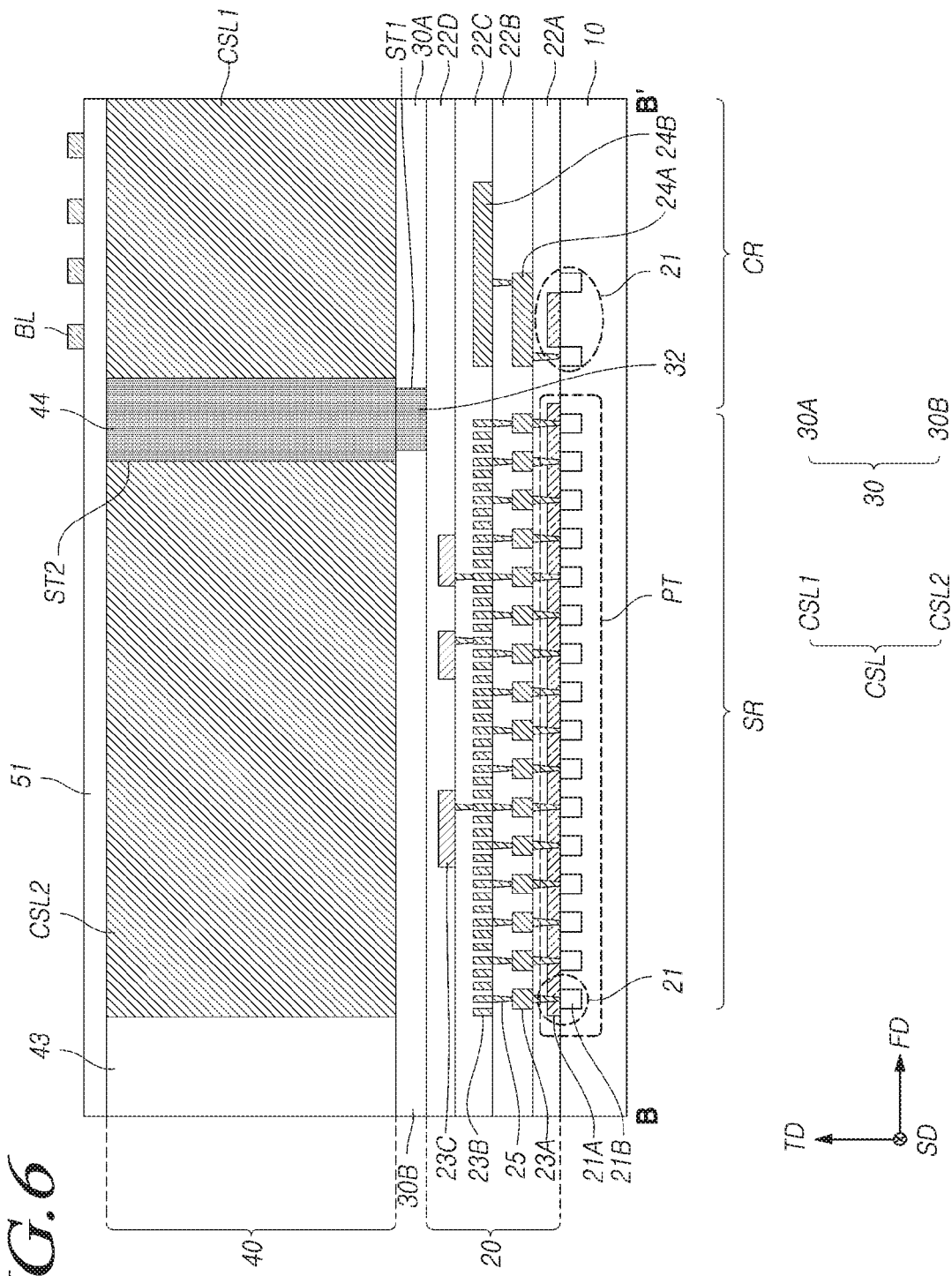
FIG. 6 is a cross-sectional view taken along the line B-B' of FIG. 4.

In accordance with an embodiment, FIG. 4 is a top view of an exemplary configuration of a portion of a semiconductor memory device. FIG. 5 is a cross-sectional view taken along the line A-A' of FIG. 4, and FIG. 6 is a cross-sectional view taken along the line B-B' of FIG. 4. For the sake of simplification in illustration, illustration of first and second top dielectric layers 43 and 51 and bit lines BL is omitted in FIG. 4.

Referring to FIGS. 4 to 6, a top surface of the substrate 10 may extend in a first direction FD and a second direction SD. The substrate 10 may be formed of or include any suitable semiconductor material. For example, the substrate 10 may be formed or include at least one selected from the group including a monocrystalline silicon layer, an SOI (silicon on insulator), a silicon layer formed on a silicon germanium (Side) layer, a monocrystalline silicon layer formed on a dielectric layer and a polysilicon layer formed on a dielectric layer.

A cell region CR and a slimming region SR may be defined in the substrate 10. In an embodiment, the slimming region SR may be disposed adjacent to the edge of the cell region CR in the first direction FD.

A logic structure 20 may be disposed on the substrate 10, and a source plate 30 may be disposed on the logic structure 20. The source plate 30 may be formed of polycrystalline silicon. Unlike the substrate 10 capable of using monocrystalline silicon, the source plate 30 is formed of polycrystalline silicon since it should be formed on a fourth bottom dielectric layer 22D of the logic structure 20.

A first slit ST1 which cuts the source plate 30 may be defined at the boundary between the cell region CR and the slimming region SR. In an embodiment, the cell region CR and the slimming region SR may be disposed along the first direction FD, and the first slit ST1 may extend along the second direction SD separating the cell region CR from the slimming region SR.

The source plate 30 may be divided into first and second source plates 30A and 30B by the first slit ST1. The first source plate 30A may be disposed in the cell region CR, and the second source plate 30B may be disposed in the slimming region SR. A first slit dielectric layer 32 may be filled in the first slit ST1. The first slit dielectric layer 32 may be formed of a dielectric material, for example, a silicon oxide layer. The second source plate 30B may be physically and electrically isolated from the first source plate 30A by the first slit ST1 and the first slit dielectric layer 32.

A memory structure 40 may be disposed on the source plate and the first slit dielectric layer 32. The memory structure 40 may include a plurality of gate electrode layers 41, a plurality of channel structures CH and the first top dielectric layer 43.

The gate electrode layers 41 may correspond to the row lines RL described above with reference to FIG. 1. The gate electrode layers 41 may be stacked on the source plate 30 of the cell region CR and the slimming region SR and the first slit dielectric layer 32 along a third direction TD in such a way as to be separated from one another. Among the gate electrode layers 41, at least one layer from the lowermost may be used as a source select line, and at least one layer from the uppermost may be used as a drain select line. The gate electrode layers 41 between the source select line and the drain select line may be used as word lines.

In order to provide pads to be brought into contact with contact plugs, the gate electrode layers 41 may have a step structure in the slimming region SR. In the slimming region SR, each of the gate electrode layers 41 may include a pad which is exposed by a gate electrode layer 41 positioned on it. Interlayer dielectric layers 42 may be disposed on and under the gate electrode layers 41. The interlayer dielectric layers 42 may be or include silicon oxide layers.

The first top dielectric layer 43 may be formed on the source plate 30 and cover the side surfaces and top surfaces of the gate electrode layers 41 and the interlayer dielectric layers 42. The first top dielectric layer 43 may be or include a silicon oxide layer.

A plurality of channel structures CH which are coupled to the first source plate 30A by passing through the first top dielectric layer 43, the interlayer dielectric layers 42 and the gate electrode layers 41 may be defined in the cell region CR. Memory cells, drain select transistors and source select transistors may be formed where the gate electrode layers 41 surround the channel structures CH.

Each of the channel structures CH may include a channel layer 47 and a gate dielectric layer 48. The channel layer 47 may be formed of or include polysilicon or monocrystalline silicon, and may include a P-type impurity such as boron (B) in some regions. The channel layer 47 may have the shape of a pillar or a solid cylinder which is completely filled up to its center. While not shown, the channel layer 47 may have the shape of a tube in which a center region is open. In this case, a buried dielectric layer may be formed in the open center region of the channel layer.

The gate dielectric layer 48 may have the shape of a straw or a cylindrical shell which surrounds the outer wall of the channel layer 47. While not shown, the gate dielectric layer 48 may include a tunnel dielectric layer, a charge storage layer and a blocking layer which are sequentially stacked from the outer wall of the channel layer 47. The tunnel dielectric layer may be formed of or include a silicon oxide, a hafnium oxide, an aluminum oxide, a zirconium oxide or a tantalum oxide. The charge storage layer may be formed or include a silicon nitride, a boron nitride, a silicon boron nitride or polysilicon doped with an impurity. The blocking layer may be formed or include a single layer or a stack layer of a silicon oxide, a silicon nitride, a hafnium oxide, an aluminum oxide, a zirconium oxide and a tantalum oxide. In some embodiments, the gate dielectric layer 48 may have an ONO (oxide-nitride-oxide) stack structure in which an oxide layer, a nitride layer and an oxide layer are sequentially stacked.

The first top dielectric layer 43, the interlayer dielectric layers 42 and the gate electrode layers 41 may be passed through by second and third slits ST2 and ST3 and dummy slits STD. The second and third slits ST2 and ST3 and the dummy slits STD may be coupled to the source plate 30 or/and the first slit dielectric layer 32.

The second slits ST2 may be disposed along the boundary between the cell region CR and the slimming region SR. The second slits ST2 may be filled with second slit dielectric layers 44. The second slit dielectric layers 44 may be coupled to the first slit dielectric layer 32. Referring to FIG. 6, the height of the second slit dielectric layers 44 may be substantially the same as the distance from the top surface of the first slit dielectric layer 32 to the top surface of the first top dielectric layer 43.

The memory structure 40 may include a plurality of memory blocks BLK. Each of the second slit dielectric layers 44 may be disposed between adjacent memory blocks BLK. The gap between adjacent second slit dielectric layers 44 may be substantially the same as the width of each memory block BLK measured in the second direction SD. The width of each of the second slit dielectric layers 44 measured in the second direction SD may be substantially the same as the gap between adjacent memory blocks BLK.

The second slit dielectric layers 44 may be utilized as guides for distinguishing the boundary between the cell region CR and the slimming region SR. The second slit dielectric layers 44 may be utilized as guides for distinguishing the boundaries between the memory blocks BLK.

The dummy slits STD may be distributed throughout the cell region CR and the slimming region SR. The dummy slits STD may be filled with dummy slit dielectric layers 45. The dummy slits STD may be simultaneously formed with the second slits ST2, and the dummy slit dielectric layers 45 may be simultaneously formed with the second slit dielectric layers 44. Some of the dummy slit dielectric layers 45 may be coupled to the first source plate 30A. Other some of the dummy slit dielectric layers 45 may be coupled to the second source plate 30B. The remaining dummy slit dielectric layers 45 may be coupled to the first slit dielectric layer 32. The second slit dielectric layers 44 and the dummy slit dielectric layers 45 may serve as the supports of the memory structure 40.

The third slits ST3 may traverse the cell region CR and the slimming region SR in the first direction FD. The first top dielectric layer 43, the interlayer dielectric layers 42, the gate electrode layers 41 and the channel structures CH may be divided into a plurality of regions by the third slits ST3. Each of the plurality of regions defined by the third slits ST3 may be provided as a memory block BLK. Each of the third slits ST3 may be divided by the second slit dielectric layer 44 at the boundary between the cell region CR and the slimming region SR.

Common source lines CSL may be formed in the third slits ST3, respectively. The height of the common source lines CSL may be substantially the same as the distance from the top surfaces of the source plate 30 and the first slit dielectric layer 32 to the top surface of the first top dielectric layer 43. Referring to FIG. 6, the height of the common source lines CSL may be substantially the same as the height of the second slit dielectric layers 44.

Each of the common source lines CSL may be divided into first and second common source lines CSL1 and CSL2 by the second slit dielectric layer 44. The first common source line CSL1 may be disposed in the cell region CR, and the second common source line CSL2 may be disposed in the slimming region SR. The first common source line CSL1 may be coupled to the first source plate 30A, and the second common source line CSL2 may be coupled to the second source plate 30B. The second source plate 30B of the slimming region SR may be electrically isolated from the first source plate 30A of the cell region CR. As will be described later, the second source plate 30B of the slimming region SR may be electrically isolated from the logic structure 20. Due to this fact, the second source plate 30B of the slimming region SR may be floated regardless of whether the semiconductor memory device operates or not.

Sidewall dielectric layers 46 may be formed on both sidewalls of the first and second common source lines CSL1 and CSL2, and may thereby isolate the first and second common source lines CSL1 and CSL2 from the gate electrode layers 41.

The second top dielectric layer 51 may be formed on the first top dielectric layer 43, the second slit dielectric layers 44, the dummy slit dielectric layers 45, the first and second common source lines CSL1 and CSL2 and the channel structures CH. The second top dielectric layer 51 may be formed of or include a silicon oxide layer. The bit lines BL may be formed on the second top dielectric layer 51, and bit line contacts BLC which pass through the second top dielectric layer 51 and are coupled to the channel structures CH may be formed under the bit lines BL.

The logic structure 20 may include a plurality of logic circuit elements 21 which are disposed on the substrate 10, bottom dielectric layers 22A to 22D which cover the logic circuit elements 21, and bottom wiring lines 23A to 23C, 24A and 24B which are disposed in the bottom dielectric layers 22A to 22D and are electrically coupled to the logic circuit elements 21.

The logic circuit elements 21 may include planar transistors. In the case where the logic circuit elements 21 are configured by planar transistors, each of the logic circuit elements 21 may include a gate 21A and a source/drain region 21B.

The logic circuit elements 21 may configure the row decoder 120, the page buffer circuit 130 and the peripheral circuit 140 of FIG. 1. In an embodiment, the logic circuit elements 21 disposed in the slimming region SR may correspond to pass transistors PT of the row decoder 120.

The bottom dielectric layers 22A to 22D may include first to fourth bottom dielectric layers 22A to 22D which are sequentially stacked on the substrate 10. The bottom wiring lines 23A to 23C, 24A and 24B may include first bottom wiring lines 23A and 24A which are disposed in a first wiring layer on the first bottom dielectric layer 22A, second bottom wiring lines 23B and 24B which are disposed in a second wiring layer on the second bottom dielectric layer 22B, and third bottom wiring lines 23C which are disposed in a third wiring layer on the third bottom dielectric layer 22C. Contact plugs 25 which electrically couple the logic circuit elements 21 and the bottom wiring lines 23A to 23C, 24A and 243 and electrically couple the bottom wiring lines 23A to 23C, 24A and 243 disposed at different layers may be formed through the first to third bottom dielectric layers 22A to 22C.

The bottom wiring lines 23A and 23B which are disposed in the slimming region SR may be used in electrically coupling the pass transistors PT and the gate electrode layers 41 of the memory structure 40.

The first source plate 30A of the cell region CR may be electrically coupled with the bottom wiring lines 23A to 23C, 24A and 24B and the logic circuit elements 21 of the logic structure 20. The second source plate 30B of the slimming region SR may be electrically decoupled from the bottom wiring lines 23A to 23C, 24A and 24B and the logic circuit elements 21 of the logic structure 20.

As a semiconductor memory device trends toward higher capacity and higher integration, the number of the gate electrode layers 41 increases, and accordingly, the number of the pass transistors PT increases as well. As the number of the pass transistors PT increases, the number of bottom wiring lines needed to couple the pass transistors PT and the gate electrode layers 41 also increases. As a consequence, the number of bottom wiring lines to be formed in the unit area of the slimming region SR becomes greater than the number of bottom wiring lines to be formed in the unit area of the cell region CR. In order to reduce the electrical interference between bottom wiring lines and the source plate 30, the separation distance between the bottom wiring lines and the source plate 30 should be increased. For this reason, the bottom wiring lines 24A and 24B of the cell region CR are disposed by avoiding the uppermost wiring layer close to the source plate 30, whereas, in the slimming region SR where the number of bottom wiring lines to be formed per unit area is large, the bottom wiring lines 23C are disposed even in the uppermost wiring layer. Since the separation distance between the source plate 30 and bottom wiring lines in the slimming region SR is shorter than that in the cell region CR, the slimming region SR is vulnerable to the electrical interference between the source plate 30 and the bottom wiring lines 23A to 23C when compared to the cell region CR.

In the operation of the semiconductor memory device, a large potential difference may be induced between the bottom wiring lines 23A to 23C, 24A and 24B of the logic structure 20 and the first source plate 30A of the cell region CR. For example, in an erase operation, an erase voltage of a high level may be applied to the first source plate 30A of the cell region CR, and a voltage of a ground level may be applied to the bottom wiring lines 23A to 23C of the slimming region SR to transfer the voltage of the ground level to the gate electrode layers 41.

When, unlike the present embodiment, the source plate 30 is not divided if a large potential difference is induced between the source plate 30 and the bottom wiring lines 23A to 23C in the operation of the semiconductor memory device, the electrical interference between the source plate 30 and the bottom wiring lines 23A to 23C may increase excessively in the slimming region SR which is vulnerable to electrical interference, whereby a malfunction of the semiconductor memory device may be caused.

According to the present embodiment, since the second source plate 30B of the slimming region SR is electrically isolated from the first source plate 30A of the cell region CR by the first slit ST1 and the first slit dielectric layer 32, the second source plate 30B of the slimming region SR is always in a floating state regardless of whether the semiconductor memory device operates or not. Consequently, in the slimming region SR which is vulnerable to electrical interference, the electrical interference between the second source plate 30B and the bottom wiring lines 23A to 23C can be suppressed.

Figure 7:
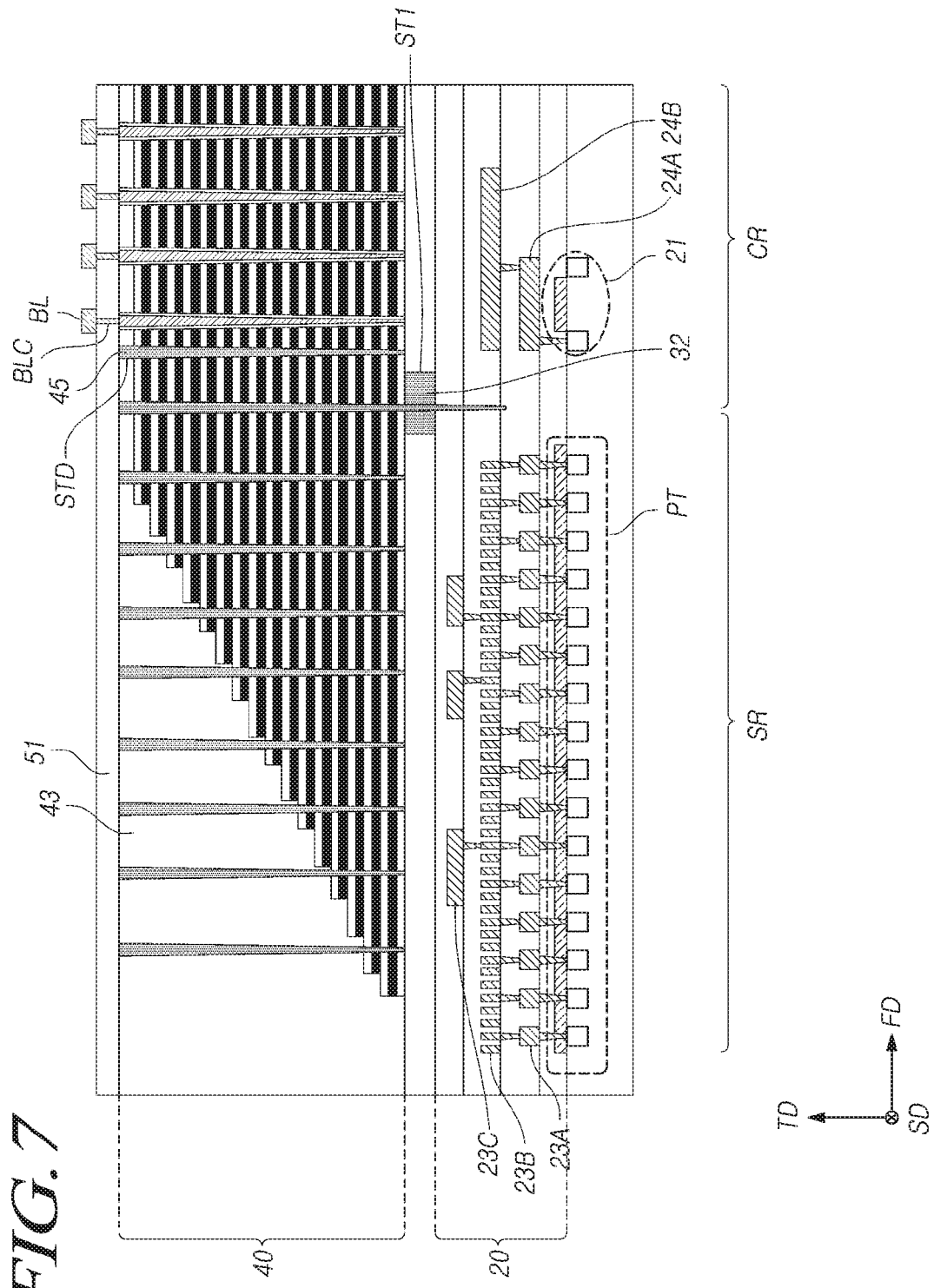
FIGS. 7 to 9 are cross-sectional views illustrating exemplary configurations of portions of semiconductor memory devices in accordance with embodiments of the present disclosure.

FIG. 7 is a cross-sectional view illustrating an exemplary configuration of a portion of a semiconductor memory device in accordance with an embodiment of the present disclosure.

Referring to FIG. 7, logic circuit elements 21 of a slimming region SR may include pass transistors PT, and may be more densely disposed when compared to logic circuit elements 21 disposed in the cell region CR. Due to this fact, the line width of bottom wiring lines 23A to 23C which are coupled to the logic circuit elements 21 of the slimming region SR may be smaller than the line width of bottom wiring lines 24A and 24B which are coupled to the logic circuit elements 21 of the cell region CR.

As is well known in the art, a wiring line having a small line width may be easily lost by etching when compared to a wiring line having a large line width. The bottom wiring lines 23A to 23C which are coupled to the logic circuit elements 21 of the slimming region SR may be easily lost by etching when compared to the bottom wiring lines 24A and 24B which are coupled to the logic circuit elements 21 of the cell region CR.

At least one of dummy slits STD may be coupled to a first slit dielectric layer 32. Dummy slit dielectric layers 45 may be filled in the dummy slits STD. Unlike a source plate 30 which has a sufficient etching selectivity with respect to etch target layers in an etching process for forming the dummy slits STD, the first slit dielectric layer 32 may not have a sufficient etching selectivity with respect to the etch target layers. For this reason, in the etching process for forming the dummy slits STD, as etching is overly performed where the first slit dielectric layer 32 is positioned, a dummy slit STD may extend to a logic structure 20 through the first slit dielectric layer 32, and the dummy slit dielectric layer 45 filled in the dummy slit STD may be coupled with the logic structure 20. In the case where the bottom wiring lines 23A to 23C coupled to the logic circuit elements 21 of the slimming region SR are disposed to overlap with the first slit dielectric layer 32 in the third direction TD, the bottom wiring lines 23A to 23C may be lost by the over-etching.

In the present embodiment, the bottom wiring lines 23A to 23C coupled to the logic circuit elements 21 of the slimming region SR may not overlap with the first slit dielectric layer 32 in the third direction TD. Since the bottom wiring lines 23A to 23C coupled to the logic circuit elements 21 of the slimming region SR are not disposed below the first slit dielectric layer 32, in the etching process for forming the dummy slits STD, even though over etching is performed at a region where the first slit dielectric layer 32 is positioned, the loss of the bottom wiring lines 23A to 23C may not occur.

Figure 8:
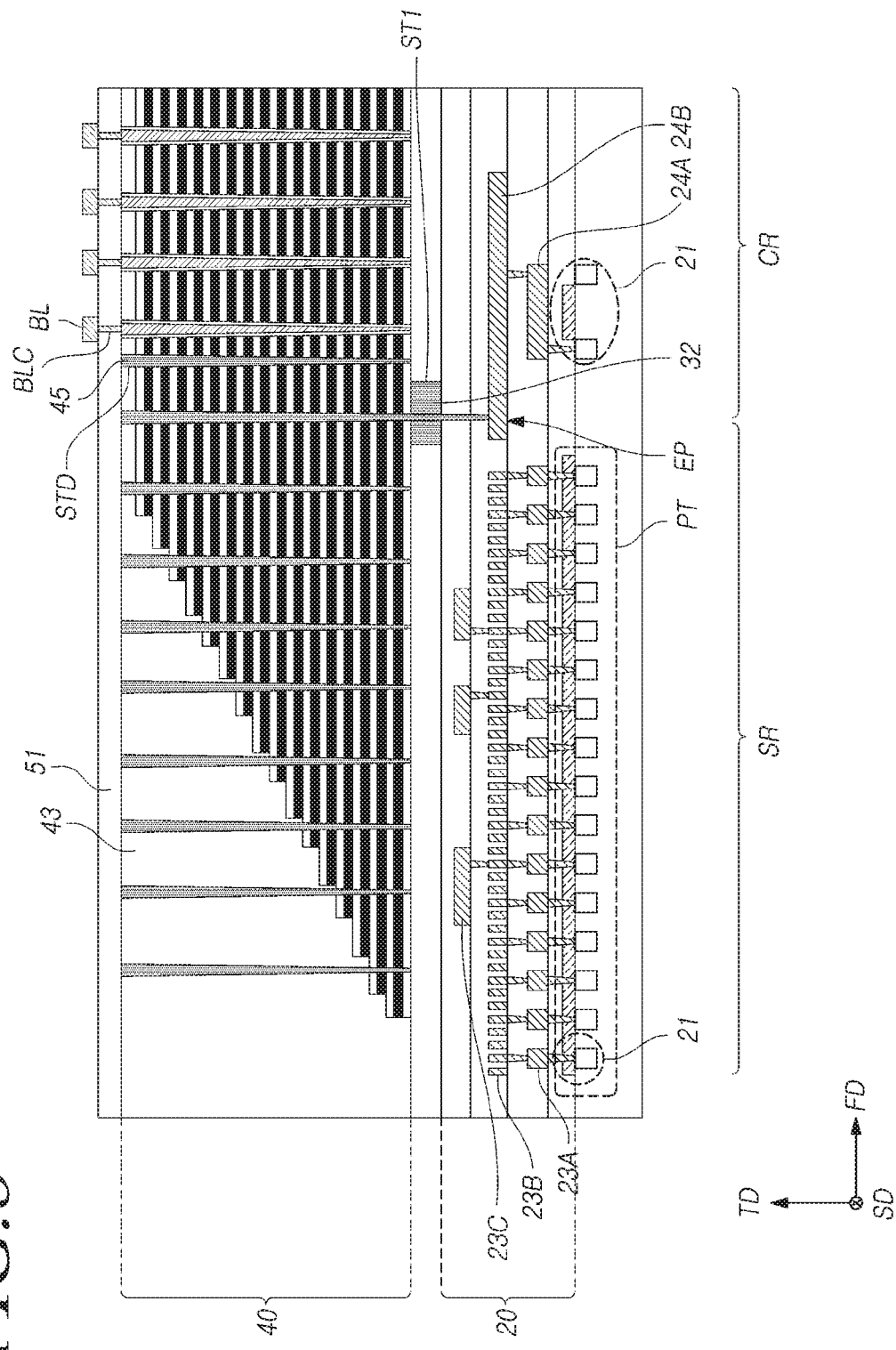

FIG. 8 is a cross-sectional view illustrating an exemplary configuration of a portion of a semiconductor memory device in accordance with an embodiment of the present disclosure.

Referring to FIG. 8, a portion of a bottom wiring line 24B which is coupled to a logic circuit element 21 of a cell region CR may extend to below a first slit dielectric layer 32. The bottom wiring line 24B may have an extended portion EP which overlaps with the first slit dielectric layer 32 in the third direction TD.

At least one of dummy slits STD may be coupled to the first slit dielectric layer 32. Dummy slit dielectric layers 45 may be filled in the dummy slits STD.

The bottom wiring line 24B may be formed of, for example, tungsten, and may have a sufficient etching selectivity with respect to etch target layers to be etched when forming the dummy slits STD. As described above, since the bottom wiring line 24B which is coupled to the logic circuit element 21 of the cell region CR has a larger line width than bottom wiring lines 23A to 23C which are coupled to logic circuit elements 21 of a slimming region SR, the extended portion EP of the bottom wiring line 24B may not be lost in an etching process for forming the dummy slits STD and may serve as an etch stopper.

Therefore, in the etching process for forming the dummy slit STD, etching in a region where the first slit dielectric layer 32 is positioned may be stopped at the extended portion EP of the bottom wiring line 24B, and the dummy slit dielectric layer 45 filled in the dummy slit STD may be coupled to the extended portion EP.

According to the present embodiment, in the etching process for forming the dummy slits STD, since etching is stopped at the extended portion EP of the bottom wiring line 24B, failures where logic circuit elements 21 are lost may be suppressed from occurring.

Figure 9:
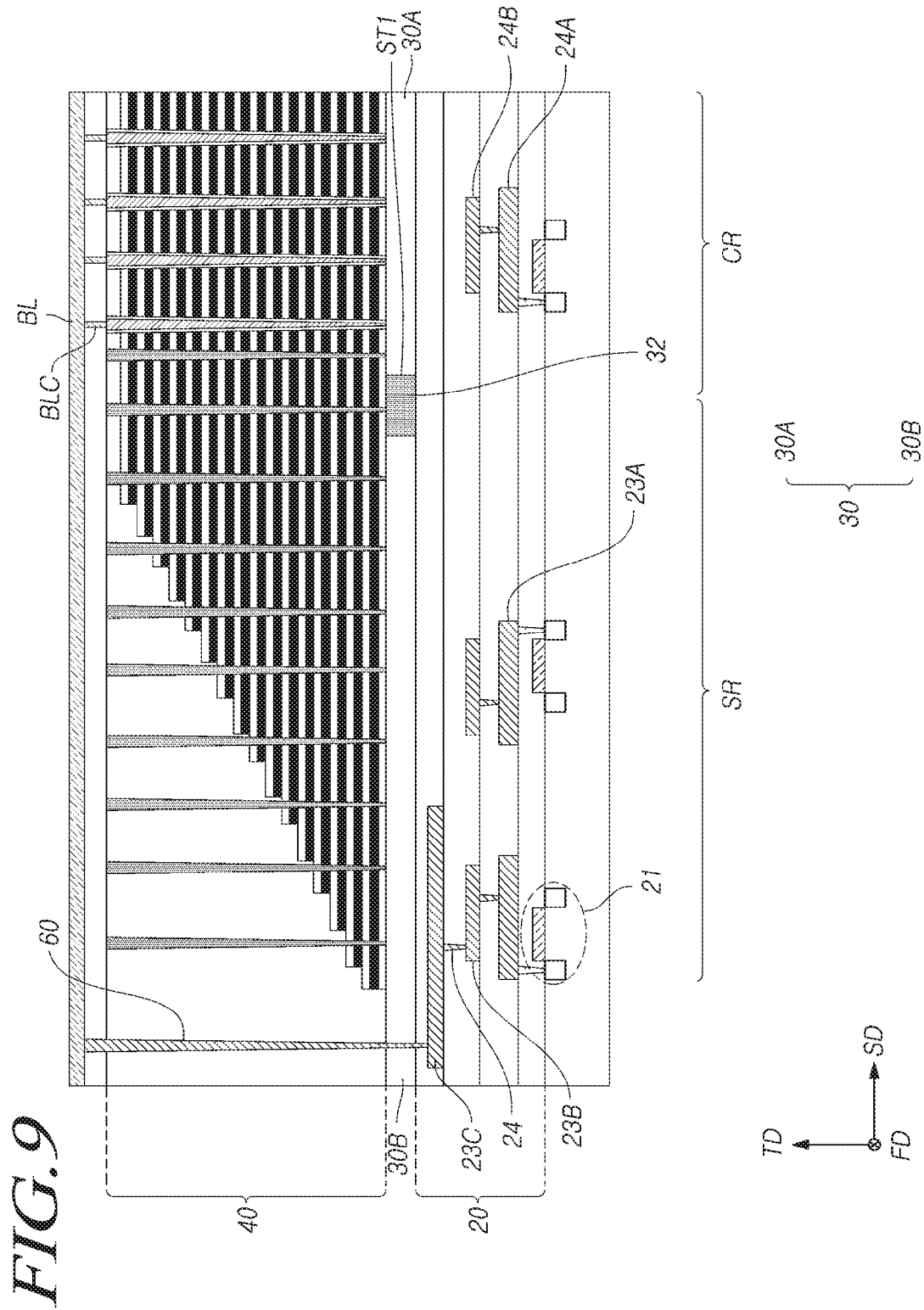

FIG. 9 is a cross-sectional view illustrating an exemplary configuration of a portion of a semiconductor memory device in accordance with an embodiment of the present disclosure. FIG. 9 is a cross-sectional view taken along the second direction SD which is the extending direction of the bit lines BL.

Referring to FIG. 9, logic circuit elements 21 disposed in a slimming region SR may correspond to elements which configure a page buffer circuit (130 of FIG. 1). As shown in FIG. 3A, elements configuring the page buffer circuit 130 may be disposed in the slimming regions SR. Although not shown, as shown in FIG. 3B, elements configuring the page buffer circuit 130 may be disposed at the edges of a cell region CR adjacent to the slimming region SR. Bottom wiring lines 23A to 23C which are disposed in the slimming region SR may be used to electrically couple logic circuit elements 21 which configure the page buffer circuit 130 to the bit lines BL.

While not shown, a plurality of bit lines BL may be repeatedly disposed along the first direction FD separated by each other by a regular interval. In order for coupling with the bit lines BL, the number of bottom wiring lines to be formed in the unit area of the slimming region SR may be greater than the number of bottom wiring to lines to be formed in the unit area of the cell region CR.

In order to reduce the electrical interference between bottom wiring lines and a source plate 30, the separation distance between the bottom wiring lines and the source plate 30 should be increased. For these reasons, bottom wiring lines 24A and 24B of the cell region CR are disposed by avoiding a wiring layer close to the source plate 30, whereas the bottom wiring lines 23A to 23C of the slimming region SR are disposed even in the wiring layer that is close to the source plate 30. Since the separation distance between the source plate 30 and the bottom wiring lines in the slimming region SR is shorter than that in the cell region CR, the slimming region SR is vulnerable to the electrical interference between the source plate 30 and the bottom wiring lines 23A to 23C when compared to the cell region CR.

In the present embodiment, a first slit ST1 which cuts the source plate 30 may be formed at the boundary between the cell region CR and the slimming region SR, and a first slit dielectric layer 32 may be filled in the first slit ST1. The source plate 30 may be divided into a first source plate 30A and a second source plate 30B. The first source plate 30A may be disposed in the cell region CR, and the second source plate 30B may be disposed in the slimming region SR. The second source plate 30B of the slimming region SR may be electrically isolated from the first source plate 30A of the cell region CR.

In the operation of the semiconductor memory device, a large potential difference may be induced between the first source plate 30A of the cell region CR and the bottom wiring lines 23A to 23C, 24A and 24B of a logic structure 20. In the case where the source plate 30 is not divided unlike the present embodiment, if a large potential difference is induced between the source plate 30 and the bottom wiring lines 23A to 23C, 24A and 24B in the operation of the semiconductor memory device, the electrical interference between the source plate 30 and the bottom wiring lines 23A to 23C may overly increase in the slimming region SR which is vulnerable to electrical interference, whereby a malfunction may be caused.

According to the present embodiment, as the second source plate 30B of the slimming region SR is electrically isolated from the first source plate 30A of the cell region CR, since the second source plate 30B of the slimming region SR is always in a floating state regardless of whether the semiconductor memory device operates or not, it is possible to suppress the electrical interference between the second source plate 30B and the bottom wiring lines 23A to 23C in the slimming region SR which is vulnerable to electrical interference.

FIGS. 10A to 15C are exemplary configurations of views to assist in the explanation of a method for manufacturing a semiconductor memory device in accordance with an embodiment of the present disclosure. FIGS. 10A to 15A illustrate planar structures in respective manufacturing steps, FIGS. 10B to 15B illustrate cross-sections taken along the lines C-C' of FIGS. 10A to 15A, and FIG. 15C illustrates a cross-section taken along the lines D-D' of FIG. 15A.

Figure 10B:
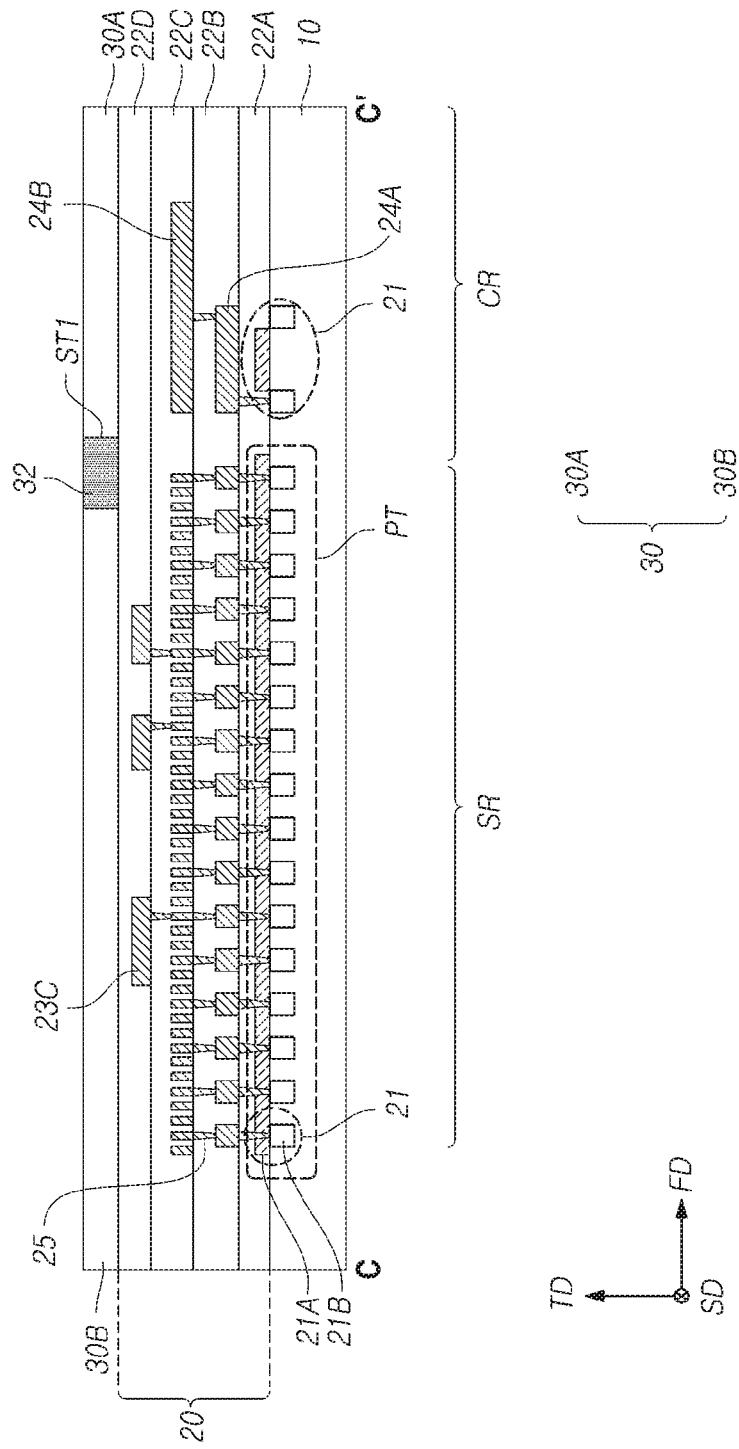

Referring to FIGS. 10A and 10B, logic circuit elements 21 may be formed on a cell region CR and a slimming region SR of a substrate 10.

The substrate 10 may be or include at least one selected from the group including a monocrystalline silicon layer, an SOI (silicon on insulator), a silicon layer formed on a silicon germanium (SiGe) layer, a monocrystalline silicon layer formed on a dielectric layer and a polysilicon layer formed on a dielectric layer.

The logic circuit elements 21 may include planar transistors. In the case where the logic circuit elements 21 are configured by planar transistors, each of the logic circuit elements 21 may include a gate 21A and a source/drain region 21B. The logic circuit elements 21 of the slimming region SR may correspond to pass transistors PT. Meanwhile, the logic circuit elements 21 of the slimming region SR may be elements which configure a page buffer circuit.

A plurality of bottom dielectric layers 22A to 22D which cover the logic circuit elements 21 may be stacked on the substrate 10, and bottom wiring lines 23A to 23C, 24A and 24B and contact plugs 25 which are electrically coupled to the logic circuit elements 21 may be formed in the bottom dielectric layers 22A to 22D.

A source plate 30 may be formed on the top surface of the uppermost bottom dielectric layer 22D among the bottom dielectric layers 22A to 22D. The source plate 30 may be formed of polycrystalline silicon. The source plate 30 may be formed by a method of forming polycrystalline silicon at a predetermined region on the bottom dielectric layer 22D and then growing the polycrystalline silicon by using the polycrystalline silicon as a seed layer.

A first slit ST1 which cuts the source plate 30 may be formed at the boundary between the cell region CR and the slimming region SR. The source plate 30 may be divided into first and second source plates 30A and 30B by the first slit ST1. The first source plate 30A may be disposed in the cell region CR, and the second source plate 30B may be disposed in the slimming region SR.

Then, by filling a dielectric layer, for example, a silicon oxide, in the first slit ST1, a first slit dielectric layer 32 may be formed.

Referring to FIGS. 11A and 11B, a plurality of sacrificial layers 70 and a plurality of interlayer dielectric layers 42 may be alternately stacked on the first and second source plates 30A and 30B and the first slit dielectric layer 32. The sacrificial layers 70 may be formed of a material which has a high etching selectivity with respect to the interlayer dielectric layers 42 and thus is able to be selectively etched. For example, the interlayer dielectric layers 42 may be silicon oxide layers, and the sacrificial layers 70 may be silicon nitride layers.

By etching the sacrificial layers 70 and the interlayer dielectric layers 42 of the slimming region SR, a step structure may be formed. In order to form the step structure, a predetermined mask layer (not shown) may be formed on the uppermost interlayer dielectric layer 42, and the interlayer dielectric layers 42 and the sacrificial layers 70 exposed by the mask layer may be etched. By performing, a plurality of times, a process of trimming the mask layer and etching the interlayer dielectric layers 42 and the sacrificial layers 70 exposed by the mask layer, the interlayer dielectric layers 42 and the sacrificial layers 70 may be sequentially etched, by which the step structure may be formed.

Figure 12B:
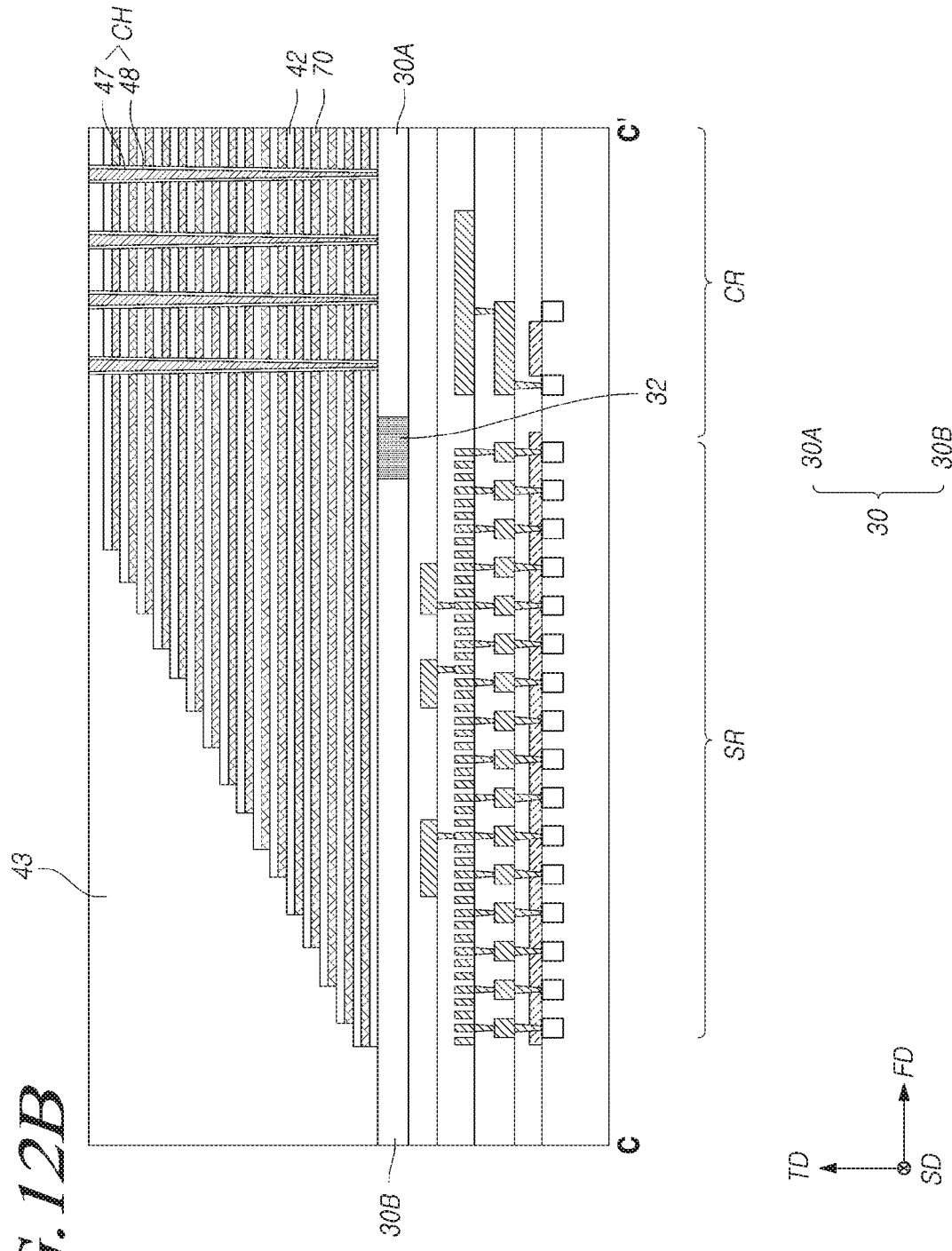

Referring to FIGS. 12A and 12B, a first top dielectric layer 43 which covers the side surfaces and top surfaces of the sacrificial layers 70 and the interlayer dielectric layers 42 may be formed on the first and second source plates 30A and 30B and the first slit dielectric layer 32. The first top dielectric layer 43 may include a silicon oxide layer.

A plurality of channel holes which are coupled to the first source plate 30A may be formed through the first top dielectric layer 43, the interlayer dielectric layers 42 and the sacrificial layers 70 of the cell region CR.

Thereafter, by forming a channel layer 47 and a gate dielectric layer 48 in each of the channel holes, channel structures CH may be formed. The channel layer 47 may have the shape of a pillar or a solid cylinder which is completely filled up to its center. While not shown, the channel layer 47 may have the shape of a tube of which center region is open. In this case, a buried dielectric layer may be formed in the open center region of the channel layer 47.

Before forming the channel layer 47, the gate dielectric layer 48 may be formed in each of the channel holes, for example, through an ALD (atomic layer deposition) or CVD (chemical vapor deposition) process. While not shown, the gate dielectric layer 48 may include a blocking layer, a charge storage layer and a tunnel dielectric layer which are sequentially stacked from a region adjacent to a corresponding sacrificial layer 70 and a corresponding interlayer dielectric layer 42. The tunnel dielectric layer may be formed or include a silicon oxide, a hafnium oxide, an aluminum oxide, a zirconium oxide or a tantalum oxide. The charge storage layer may be formed or include a silicon nitride, a boron nitride, a silicon boron nitride or polysilicon doped with an impurity. The blocking layer may be formed or include a single layer or a stack layer of a silicon oxide, a silicon nitride, a hafnium oxide, an aluminum oxide, a zirconium oxide and a tantalum oxide. The channel layer 47 may be formed inward of the tunnel dielectric layer. In some embodiments, the gate dielectric layer 48 may have an ONO stack structure in which an oxide layer, a nitride layer and an oxide layer are sequentially stacked.

Referring to FIGS. 13A and 13B, by etching the first top dielectric layer 43, the sacrificial layers 70 and the interlayer dielectric layers 42, second slits ST2 and dummy slits STD which pass through them may be formed. The first and second source plates 30A and 30B may serve as an etch stopper in the etching process for forming the second slits ST2 and the dummy slits STD.

The second slits ST2 may be disposed along the boundary between the cell region CR and the slimming region SR. In an embodiment, the boundary between the cell region CR and the slimming region SR may extend in the second direction SD, and the second slits ST2 may be disposed along the second direction SD. The gap between adjacent second slits ST2 may correspond to the width of each memory block in the second direction SD. The width of each of the second slits ST2 that is measured in the second direction SD may correspond to the gap between adjacent memory blocks. The dummy slits STD may be distributed throughout the cell region CR and the slimming region SR.

Then, by filling a dielectric material, for example, a silicon oxide, in the second slits ST2 and the dummy slits STD, second slit dielectric layers 44 and dummy slit dielectric layers 45 may be formed. The second slit dielectric layers 44 and the dummy slit dielectric layers 45 may serve as supports in a process to be described hereunder with reference to FIGS. 14A and 14B.

Figure 14A:
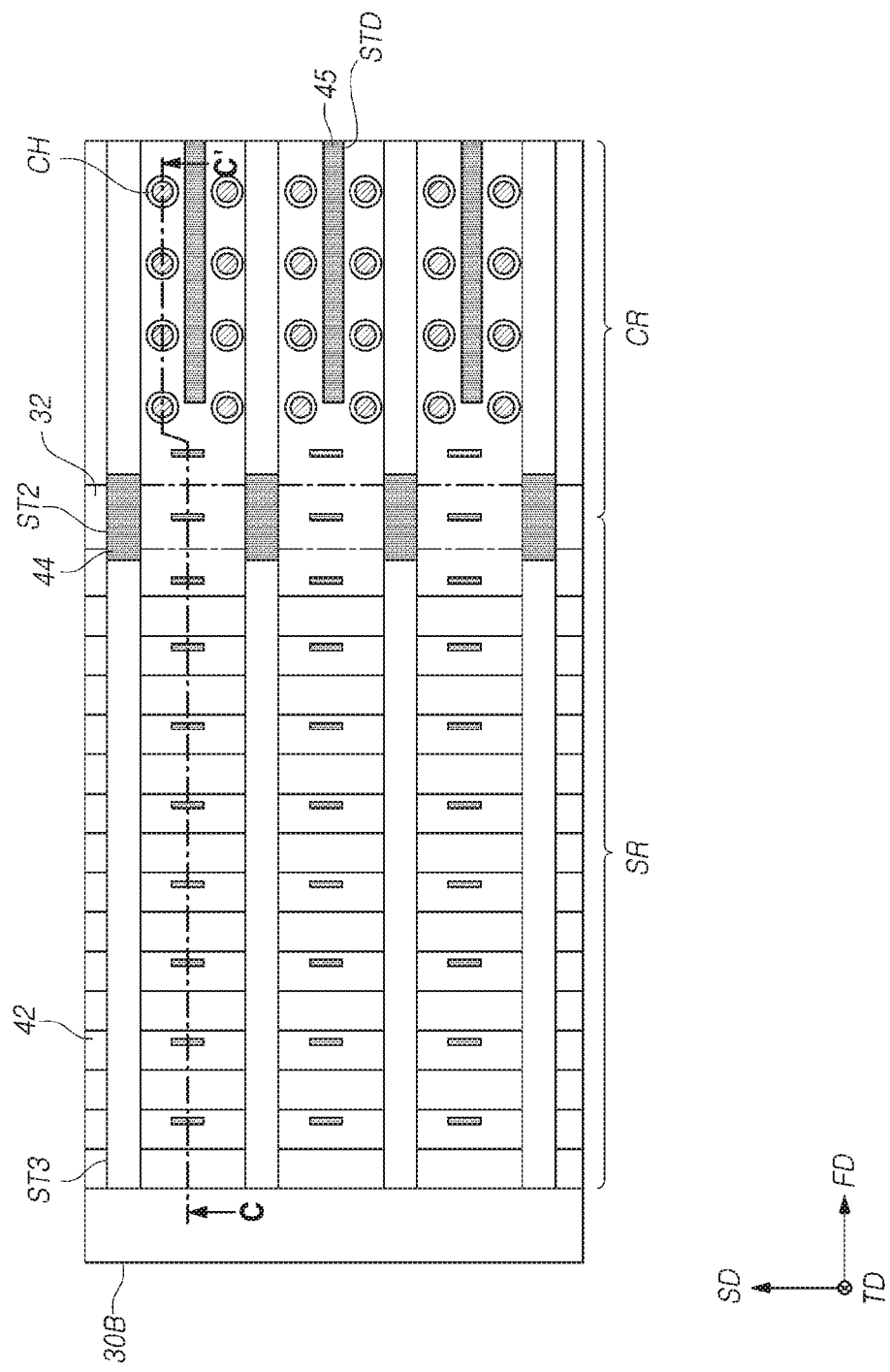

Referring to FIGS. 14A and 14B, by etching the first top dielectric layer 43, the sacrificial layers 70 and the interlayer dielectric layers 42, third slits ST3 which pass through them may be formed. Each of the third slits ST3 may have a shape which traverses the cell region CR and the slimming region SR in the first direction FD. The first top dielectric layer 43, the sacrificial layers 70, the interlayer dielectric layers 42 and the channel structures CH may be divided into a plurality of regions by the third slits ST3. Each of the plurality of regions defined by the third slits ST3 may be defined as a memory block. The third slits ST3 may be divided by the second slit dielectric layers 44 at the boundary between the cell region CR and the slimming region SR.

The third slits ST3 may be used as introduction paths of an etching material in the course of selectively removing the sacrificial layers 70. The sacrificial layers 70 may be selectively removed by an etchant which is introduced through the third slits ST3. By removing the sacrificial layers 70, a plurality of horizontal openings H may be defined between the interlayer dielectric layers 42. By the horizontal openings H, portions of the side surfaces of the gate dielectric layers 48 may be exposed. Even though the sacrificial layers 70 are removed, the interlayer dielectric layers 42 and the first top dielectric layer 43 may be securely supported by the second slit dielectric layers 44 and the dummy slit dielectric layers 45.

Figure 15A:
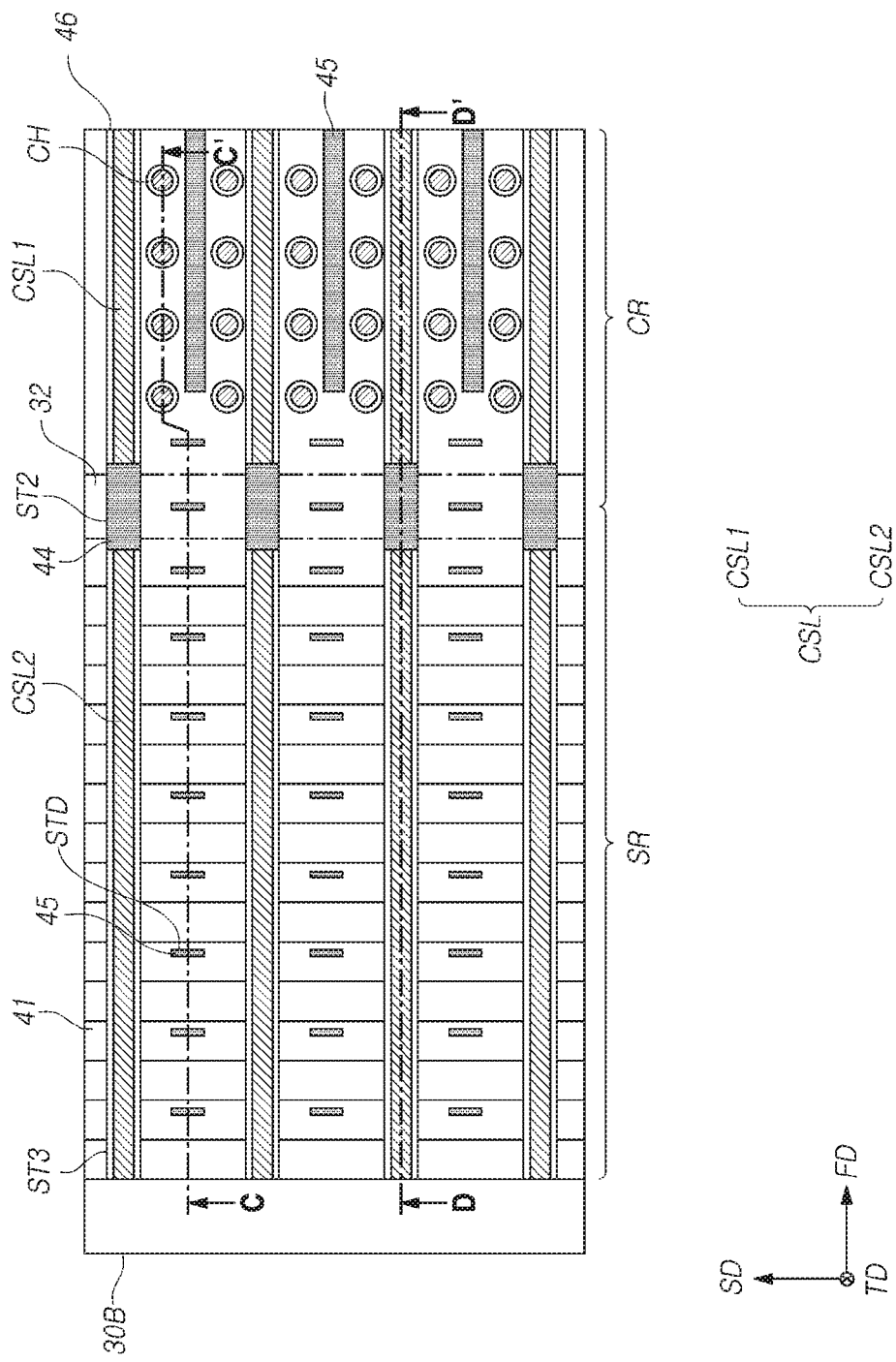
Figure 15C:
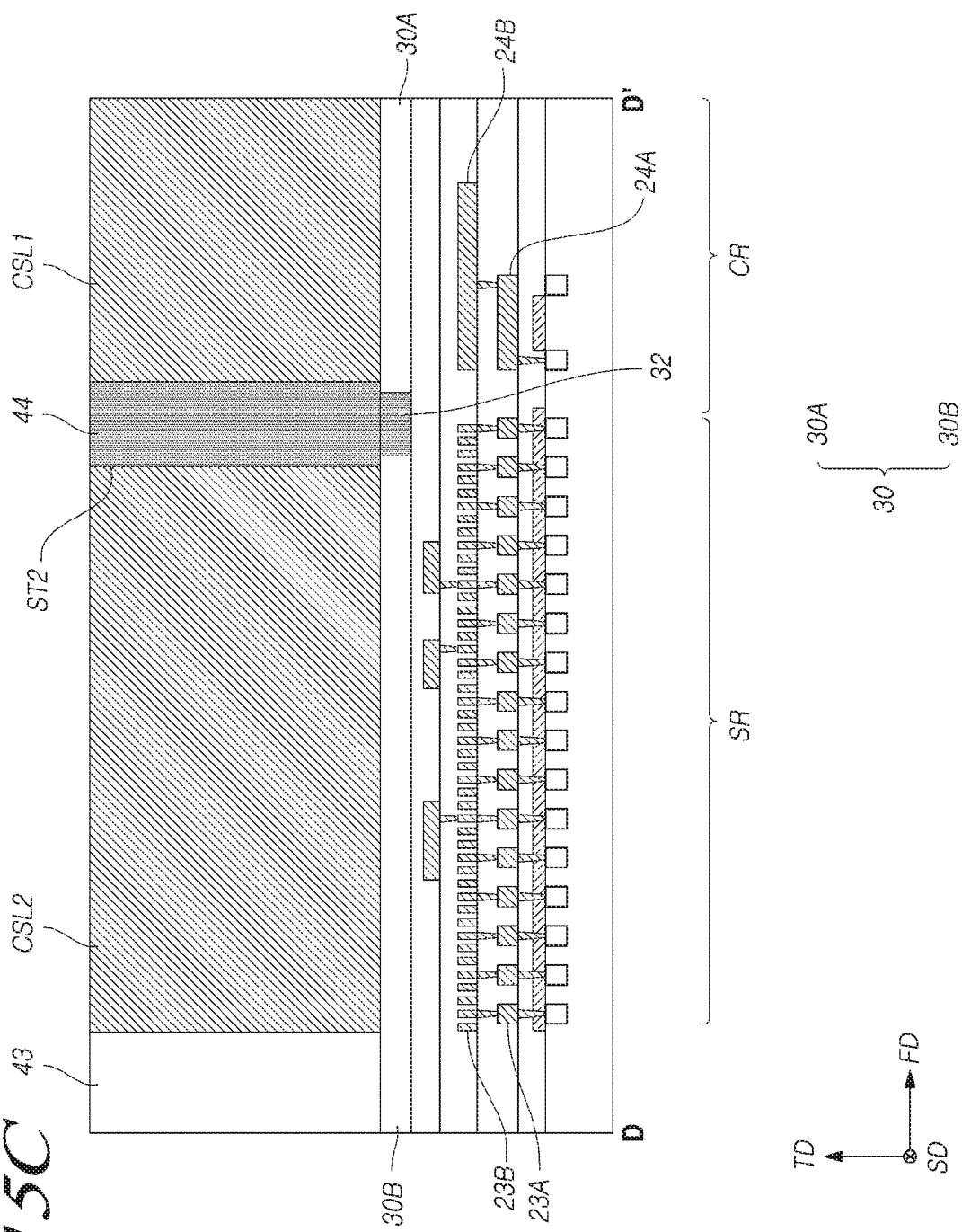

Referring to FIGS. 15A to 15C, a plurality of gate electrode layers 41 may be formed in the plurality of horizontal openings H which are defined as the sacrificial layers 70 are removed. The gate electrode layers 41 may be formed or include a metal, polycrystalline silicon or a metal silicide material.

By forming sidewall dielectric layers 46 on the side surfaces of the third slits ST3 and filling a conductive material in the third slits ST3 which are formed with the sidewall dielectric layers 46, common source lines CSL may be formed. Each of the common source lines CSL may be divided into first and second common source lines CSL1 and CSL2 by the second slit dielectric layer 44. The first common source line CSL1 may be disposed in the cell region CR, and the second common source line CSL2 may be disposed in the slimming region SR. Second common source lines CSL2 may be physically and electrically isolated from first common source lines CSL1 by the second slit dielectric layers 44. The bottom end of the first common source line CSL1 may be coupled to the first source plate 30A of the cell region CR, and the bottom end of the second common source line CSL2 may be coupled to the second source plate 30B of the slimming region SR.

Thereafter, as shown in FIGS. 5 and 6, the second top dielectric layer 51 may be formed on the first top dielectric layer 43, the second slit dielectric layers 44, the dummy slit dielectric layers 45, the common source lines CSL and the channel structures CH. The second top dielectric layer 51 may include a silicon oxide layer.

Then, the bit line contacts BLC which are coupled to the channel structures CH may be formed through the second top dielectric layer 51, and the bit lines BL which are coupled to the bit line contacts BLC may be formed on the second top dielectric layer 51.

Figure 16:
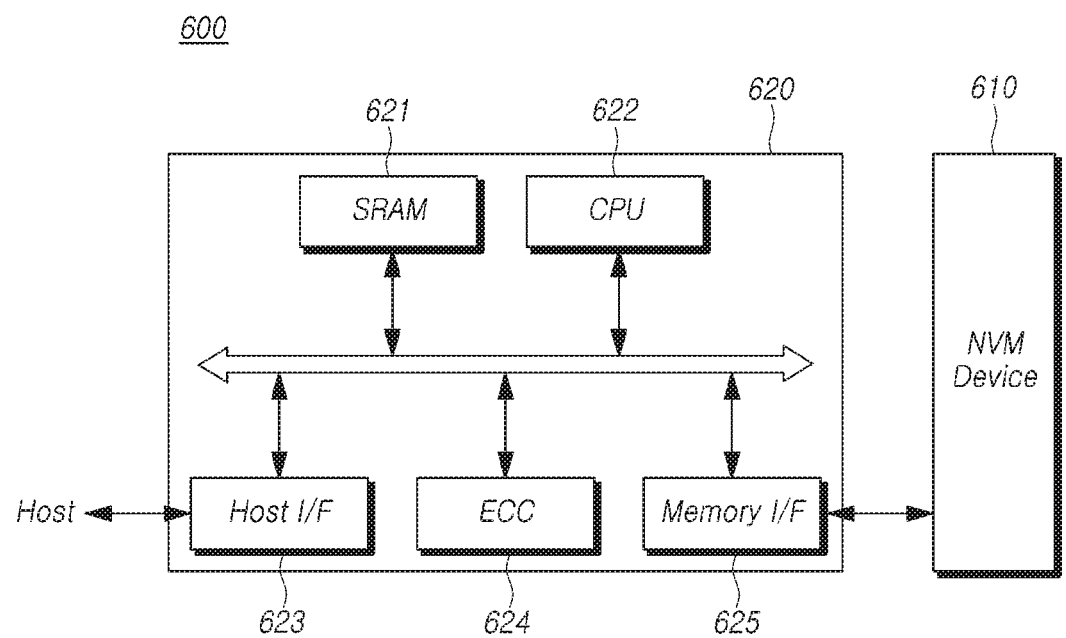
FIG. 16 is a block diagram schematically illustrating an exemplary configuration of a memory system including a semiconductor memory device in accordance with an embodiment of the present disclosure.

FIG. 16 is a simplified block diagram schematically illustrating a memory system including a memory device according to an embodiment of the present invention.

Referring to FIG. 16, the memory system 600 may include the semiconductor memory device 610 and a memory controller 620.

The semiconductor memory device 610 may be comprised the memory device according to an embodiment of the invention as described above, and may be operated in the manner described above. The memory controller 620 may control the semiconductor memory device 610. For example, the combination of the semiconductor memory device 610 and the memory controller 620, may be configured as a memory card or a solid-state disk (SSD). The memory controller 620 may include an SRAM 621, a central processing unit (CPU) 622, a host interface 623, an ECC block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the semiconductor memory device 610.

The memory interface 625 may interface with the semiconductor memory device 610. The CPU 622 may perform general control operations for data exchange of the memory controller 620.

Although not shown, it should become apparent to a person skilled in the art that the memory system 600 may further be provided with a ROM which stores code data for interfacing with the host. The semiconductor memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid-state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 17:
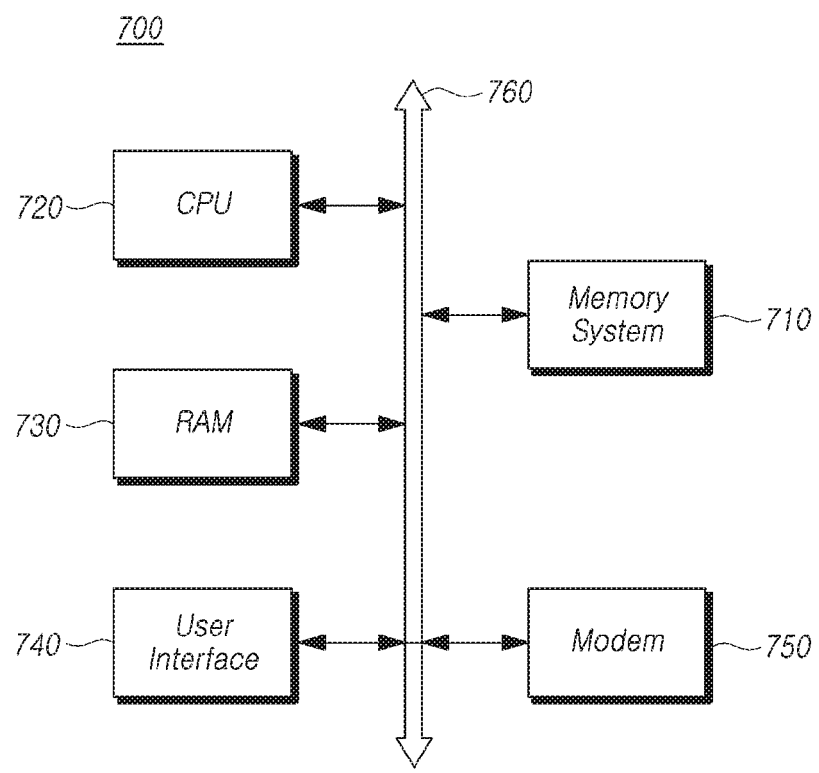
FIG. 17 is a block diagram schematically illustrating an exemplary configuration of a computing system including a semiconductor memory device in accordance with an embodiment of the present disclosure.

FIG. 17 is a simplified block diagram schematically illustrating a computing system including a memory device, according to an embodiment of the present invention.

Referring to FIG. 17, a computing system 700 according to an embodiment may include a memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid-state drive/disk) which uses a nonvolatile memory to store data. Also, as an example, the memory system 710 may be provided as a fusion flash memory (for example, a NAND or a NOR flash memory).

It is noted that the above-described embodiments are not realized only by a device and a method, but they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   a substrate including a cell region and a slimming region;
   a logic structure disposed over the substrate, the logic structure including logic circuit elements and bottom wiring lines electrically coupled to the logic circuit elements;
   a source plate disposed over the logic structure;
   a memory structure including a plurality of memory cells and a plurality of gate electrode layers, wherein the plurality of memory cells are disposed over the source plate of the cell region and the plurality of gate electrode layers are stacked over the source plate of the cell region and the slimming region to be separated from one another and are coupled to the plurality of memory cells; and
   a first slit cutting the source plate at a boundary between the cell region and the slimming region, and dividing the source plate into a first portion in the cell region and a second portion in the slimming region,
   wherein the second portion of the source plate is electrically isolated from the first portion of the source plate, the second portion of the source plate is electrically floated regardless of an operation of the memory cells and the logic circuit elements.

2. The semiconductor memory device according to claim 1, wherein the gate electrode layers have a stepped structure in the slimming region.

3. The semiconductor memory device according to claim 1, wherein the logic circuit elements comprise pass transistors which transfer voltages to the gate electrode layers.

4. The semiconductor memory device according to claim 3, wherein the pass transistors are disposed in the slimming region.

5. The semiconductor memory device according to claim 4, wherein bottom wiring lines disposed in the slimming region are used in electrically coupling the pass transistors and the gate electrode layers.

6. The semiconductor memory device according to claim 1, wherein the logic circuit elements comprise a page buffer circuit which is electrically coupled with bit lines coupled to channel structures.

7. The semiconductor memory device according to claim 6, wherein bottom wiring lines disposed in the slimming region are used in electrically coupling the page buffer circuit and the bit lines.

8. The semiconductor memory device according to claim 1, further comprising:
   a first slit dielectric layer filled in the first slit.

9. The semiconductor memory device according to claim 8, further comprising:
   a plurality of dummy slit dielectric layers passing through the memory structure in a direction perpendicular to a top surface of the substrate, and supporting the memory structure.

10. The semiconductor memory device according to claim 9, wherein at least one of the dummy slit dielectric layers is coupled to the logic structure through the first slit dielectric layer.

11. The semiconductor memory device according to claim 9, wherein bottom wiring lines, which are electrically coupled to logic circuit elements disposed in the slimming region, do not overlap with the first slit dielectric layer in the direction perpendicular to the top surface of the substrate.

12. The semiconductor memory device according to claim 9, wherein at least one of bottom wiring lines, which are electrically coupled to logic circuit elements disposed in the cell region, has an extended portion overlapping with the first slit dielectric layer in the direction perpendicular to the top surface of the substrate.

13. The semiconductor memory device according to claim 12, wherein a bottom end of the dummy slit dielectric layer passing through the first slit dielectric layer is coupled to the extended portion.

14. A semiconductor memory device comprising:
a memory structure including a plurality of gate electrode layers and a plurality of interlayer dielectric layers, which are alternately stacked over a source plate of a cell region and a slimming region, and a plurality of channel structures coupled to the source plate of the cell region through the gate electrode layers and the interlayer dielectric layers;
a logic structure disposed between a substrate and the source plate, and including logic circuit elements configured to control the memory structure and bottom wiring lines which are coupled to the logic circuit elements; and
a first slit cutting the source plate at a boundary between the cell region and the slimming region, and dividing the source plate into a first portion in the cell region and a second portion in the slimming region,
wherein the second portion of the source plate is electrically isolated from the first portion of the source plate, the second portion of the source plate is electrically isolated from the source plate of the cell region and the logic structure.

15. The semiconductor memory device according to claim 14, wherein the source plate of the slimming region is floated.

16. The semiconductor memory device according to claim 14, further comprising:
a first slit dielectric layer filled in the first slit.

17. The semiconductor memory device according to claim 16, wherein further comprising:
a plurality of second slit dielectric layers coupled to the first slit dielectric layer through the memory structure at the boundary between the cell region and the slimming region.

18. The semiconductor memory device according to claim 17,
wherein the memory structure comprises a plurality of memory blocks, and
wherein the memory blocks and the second slit dielectric layers are alternately disposed along a second direction crossing with a first direction.

19. The semiconductor memory device according to claim 18, wherein a width of each of the second slit dielectric layers, that is measured in the second direction, is the same as a gap between the memory blocks, and a gap between the second slit dielectric layers is the same as a width of each of the memory blocks that is measured in the second direction.

20. The semiconductor memory device according to claim 17, further comprising:
third slits dividing the memory structure into a plurality of memory blocks; and
a plurality of common source lines disposed in the third slits,
wherein each of the common source lines comprises:
a first common source line coupled to the source plate of the cell region; and
a second common source line coupled to the source plate of the slimming region and electrically isolated from the first common source line.

21. The semiconductor memory device according to claim 20, wherein one of the second slit dielectric layers is disposed between the first common source line and the second common source line.

22. A semiconductor memory device comprising:
a substrate including a cell region and a slimming region;
a logic structure disposed over the substrate, the logic structure including logic circuit elements and bottom wiring lines electrically coupled to the logic circuit elements;
a source plate disposed on the logic structure;
a memory structure disposed over the source plate of the cell region, the memory structure including a plurality of spaced-apart gate electrode layers having a stepped structure in the slimming region; and
a first slit cutting the source plate at a boundary between the cell region and the slimming region, and dividing the source plate into a first portion in the cell region and a second portion in the slimming region,
wherein the second portion of the source plate is electrically isolated from the first portion of the source plate, the second portion of the source plate is electrically floated regardless an operation of the memory cells and the logic circuit elements.

* * * * *